US008486818B2

(12) United States Patent
Yeom

(10) Patent No.: US 8,486,818 B2
(45) Date of Patent: Jul. 16, 2013

(54) SEMICONDUCTOR DEVICES INCLUDING BURIED GATE ELECTRODES AND ISOLATION LAYERS AND METHODS OF FORMING SEMICONDUCTOR DEVICES INCLUDING BURIED GATE ELECTRODES AND ISOLATION LAYERS USING SELF ALIGNED DOUBLE PATTERNING

(75) Inventor: Kye-Hee Yeom, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 275 days.

(21) Appl. No.: 12/588,747

(22) Filed: Oct. 27, 2009

(65) Prior Publication Data
US 2010/0102371 A1 Apr. 29, 2010

(30) Foreign Application Priority Data
Oct. 27, 2008 (KR) .................. 10-2008-0105075

(51) Int. Cl.
H01L 21/76224 (2006.01)
(52) U.S. Cl.
USPC ........... 438/589; 438/221; 438/248; 438/296; 438/391; 257/E21.546; 257/E21.548; 257/E29.02
(58) Field of Classification Search
USPC ........................................ 438/589
See application file for complete search history.

(56) References Cited

U.S. PATENT DOCUMENTS

| 6,091,129 | A  | * | 7/2000 | Cleeves | 257/510 |
|---|---|---|---|---|---|
| 2002/0192911 | A1 | * | 12/2002 | Parke | 438/270 |
| 2003/0132480 | A1 | * | 7/2003 | Chau et al. | 257/332 |
| 2006/0065922 | A1 |   | 3/2006 | Kleint et al. | |
| 2007/0148968 | A1 | * | 6/2007 | Kwon et al. | 438/671 |
| 2008/0048251 | A1 | * | 2/2008 | Disney et al. | 257/330 |
| 2008/0048333 | A1 | * | 2/2008 | Seo et al. | 257/773 |
| 2008/0160769 | A1 |   | 7/2008 | Kim | |
| 2009/0114991 | A1 | * | 5/2009 | Kim et al. | 257/365 |
| 2010/0163976 | A1 | * | 7/2010 | Lee et al. | 257/330 |
| 2010/0193901 | A1 | * | 8/2010 | Jang et al. | 257/520 |
| 2010/0330775 | A1 | * | 12/2010 | Shin et al. | 438/430 |

FOREIGN PATENT DOCUMENTS

| KR | 10-2007-0002397 A | 1/2007 |
|---|---|---|
| KR | 10-0824995 B1 | 4/2008 |

* cited by examiner

Primary Examiner — Calvin Lee
Assistant Examiner — Abul Kalam
(74) Attorney, Agent, or Firm — Lee & Morse, P.C.

(57) ABSTRACT

A semiconductor device, including a semiconductor substrate including isolations defining active regions of the semiconductor substrate, and a plurality of buried gate electrodes between a pair of the isolations, wherein each of the buried gate electrodes and the isolations includes a conductive layer and a capping layer.

12 Claims, 21 Drawing Sheets

SEMICONDUCTOR DEVICES INCLUDING BURIED GATE ELECTRODES AND ISOLATION LAYERS AND METHODS OF FORMING SEMICONDUCTOR DEVICES INCLUDING BURIED GATE ELECTRODES AND ISOLATION LAYERS USING SELF ALIGNED DOUBLE PATTERNING

BACKGROUND

1. Field

Embodiments relate to buried channel array transistor (BCAT) devices and methods of forming BCATs. More particularly, embodiments relate to BCAT devices and methods of forming BCATs including buried gate electrodes and isolation patterns using self aligned double patterning.

2. Description of the Related Art

As semiconductor devices are becoming more and more integrated, device characteristics are degrading. For example, threshold voltages of devices, e.g., transistors, may be lowered. Refresh characteristics may also be degraded as channel lengths of transistors are shortened. Buried channels may be employed to help alleviate, e.g., such problems.

SUMMARY

Embodiments are therefore directed to semiconductor devices and methods of fabricating semiconductor devices, which substantially overcome one or more of the problems due to the limitations and disadvantages of the related art.

It is therefore a feature of an embodiment to provide semiconductor devices including BCATs and isolation patterns using self aligned double patterning.

It is therefore a separate feature of an embodiment to provide semiconductor devices including BCATs and isolation patterns in which the isolation patterns and the gate electrodes of the BCATs include at least two same layers, e.g., the isolation patterns and the gate electrodes each include a conductive pattern and a capping pattern on the conductive pattern.

It is therefore a separate feature of an embodiment to provide methods of forming semiconductor devices in which gate electrodes of BCATs and isolation patterns are simultaneously formed.

It is therefore a separate feature of an embodiment to provide methods of forming semiconductor devices in which margins of buried contact areas are improved.

It is therefore a separate feature of an embodiment to provide methods of forming semiconductor devices requiring fewer fabrication steps, e.g., fewer photoresist steps.

At least one of the above and other features and advantages may be realized by providing a semiconductor device, including a semiconductor substrate including isolations defining active regions of the semiconductor substrate, and a plurality of buried gate electrodes between a pair of the isolations, wherein each of the buried gate electrodes and the isolations includes a conductive layer and a capping layer.

An upper surface of the conductive layer may be below an upper surface of the semiconductor substrate.

The conductive layers of the buried gate electrodes and the isolations may be a same conductive material, and the capping layers of the buried gate electrodes and the isolations may be a same capping material.

An upper surface of the capping layer is substantially and/or completely aligned with an upper surface of the semiconductor substrate.

The conductive layers of the buried gate electrodes and the conductive layers of the isolations may be completely below an upper surface of the semiconductor substrate and the capping layers may completely cover an upper surface of the conductive layers.

The conductive layer may include a metal layer, a metal silicide layer and/or a poly-silicon layer, and the capping layer may include a silicon oxide layer, a silicon nitride layer and/or a silicon oxynitride layer.

The conductive layer may include TiN and/or TiSi, and the capping layer may include SiN.

The semiconductor device may further include a gate insulating layer between the conductive layers and the semiconductor substrate.

The buried gate electrodes may extend along a first direction crossing a direction along which the active regions extend.

The active regions may have a line-type structure.

The isolations may include a plurality of line type structures extending along a first direction crossing a direction along which the active regions extend.

A conductive line extending over the isolations along a second direction crossing the first direction may electrically connect the isolations together.

The semiconductor device may further include an insulating layer on the active regions and the isolations, a plurality of capacitive structures on the insulating layer, a plurality of bit lines extending within the insulating layer, and a plurality of conductive patterns extending within the insulating layer, wherein the active regions may include first active regions associated with respective ones of the bit lines and second active regions associated with respective ones of the capacitive structures, each of the bit lines may be electrically connected to at least one of the first active regions, the conductive patterns may electrically connect one the capacitive structures to one of the second active regions, respectively, and the conductive patterns may be electrically isolated from the bit lines.

The semiconductor substrate may include a cell region and a peripheral region, and the isolations may be on the cell region of the semiconductor substrate and the device may further include peripheral isolations on the peripheral region of the semiconductor substrate, the peripheral isolations may be materially and/or structurally different from the isolations on the cell region.

A bottom surface of the isolations may be further from an upper surface of the semiconductor substrate than a bottom surface of the buried gate electrode.

A width of the isolations may be greater than a width of the buried gates.

At least one of the above and other features and advantages may be separately realized by providing a system, including a controller, and a memory device, the memory device, including a semiconductor substrate including isolations defining active regions of the semiconductor substrate, and a plurality of buried gate electrodes between a pair of the isolations, wherein each of the buried gate electrodes and the isolations includes a conductive layer and a capping layer, wherein the controller is adapted to program data in and erase data from the memory device.

The memory device may be a DRAM-flash type memory system.

At least one of the above and other features and advantages may be separately realized by providing a method of forming a semiconductor device, including forming and patterning a plurality of layers on a semiconductor substrate to form a patterned structure, simultaneously forming isolation trenches and buried gate trenches in the semiconductor substrate by selectively removing portions of the patterned structure, the isolation trenches defining active regions of the semiconductor substrate, forming a conductive pattern in the isolation trenches and the buried gate trenches, and forming a capping layer on the conductive patterns in the isolation trenches and the buried gate trenches.

The method may include forming a gate insulating layer in the isolation trenches and the buried gate trenches.

Forming the conductive patterns may include forming the conductive patterns such that an upper surface of the conductive pattern is below an upper surface of the semiconductor substrate, forming the capping layers may include covering exposed surfaces of the conductive patterns, and an upper surface of the capping layer may be substantially and/or completely aligned with the upper surface of the semiconductor substrate.

Forming and patterning the plurality of layers to form the patterned structure may include forming a first insulation layer on the semiconductor substrate, forming a patterning layer on the first insulation layer, forming a pattern by patterning the patterning layer to expose portions of the first insulation layer and define trenches in the pattern, forming a first layer on the portions of the first insulation layer exposed by the pattern to partially fill the trenches defined by the pattern, forming a second layer on the first insulation layer, the second layer filling the partially filled trenches defined by the pattern, performing a planarization process to expose upper surfaces of the pattern, the first layer and the second layer, removing the pattern to expose sidewalls of the first layer, forming spacers on the sidewalls of the first layer, and removing a portion of the first insulation layer to expose portions of the semiconductor substrate.

Simultaneously forming isolation trenches and buried gate trenches in the semiconductor substrate may include etching portions of the semiconductor substrate exposed by the first insulation layer and portions of the semiconductor substrate below exposed portions of the first layer.

A material of the spacers and a material of the second layer may be same.

A distance between adjacent ones of the spacers may be greater than a distance between facing wall portions of a respective one of the spacers and the second layer.

Forming the conductive pattern may include depositing a same conductive material in the isolation trenches and the buried gate trenches.

Forming the capping layer may include depositing a same capping material on the conductive patterns in the isolation trenches and the buried gate trenches.

The semiconductor substrate may include a cell region and a peripheral region, simultaneously forming isolation trenches and buried gate trenches in the semiconductor substrate may include simultaneously forming the isolation trenches and the gate trenches on the cell region of the semiconductor substrate, and the method may further include forming peripheral isolations in the peripheral region independently of forming the isolation trenches and the buried gate trenches in the cell region.

The method may include forming a conductive line that electrically connects the conductive patterns of the isolations trenches together.

BRIEF DESCRIPTION OF THE DRAWINGS

The above and other features and advantages of embodiments will become more apparent to those of ordinary skill in the art by describing in detail exemplary embodiments with reference to the attached drawings, in which.

DETAILED DESCRIPTION

Korean Patent Application No. 2008-0105075, filed on Oct. 27, 2008, in the Korean Intellectual Property Office, and entitled: "Semiconductor Device With Have Buried Gate Electrode And Isolation Layer Using Self Aligned Double patterning Technology And A Method For Manufacturing The Same," is incorporated by reference herein in its entirety.

Embodiments of one or more aspects of the invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art. Further, some elements that are not essential to the complete understanding of the exemplary embodiments and/or are well known may be omitted. For example, when describing a transistor gate structure, a description of a gate oxide layer may be omitted.

Figure 1:
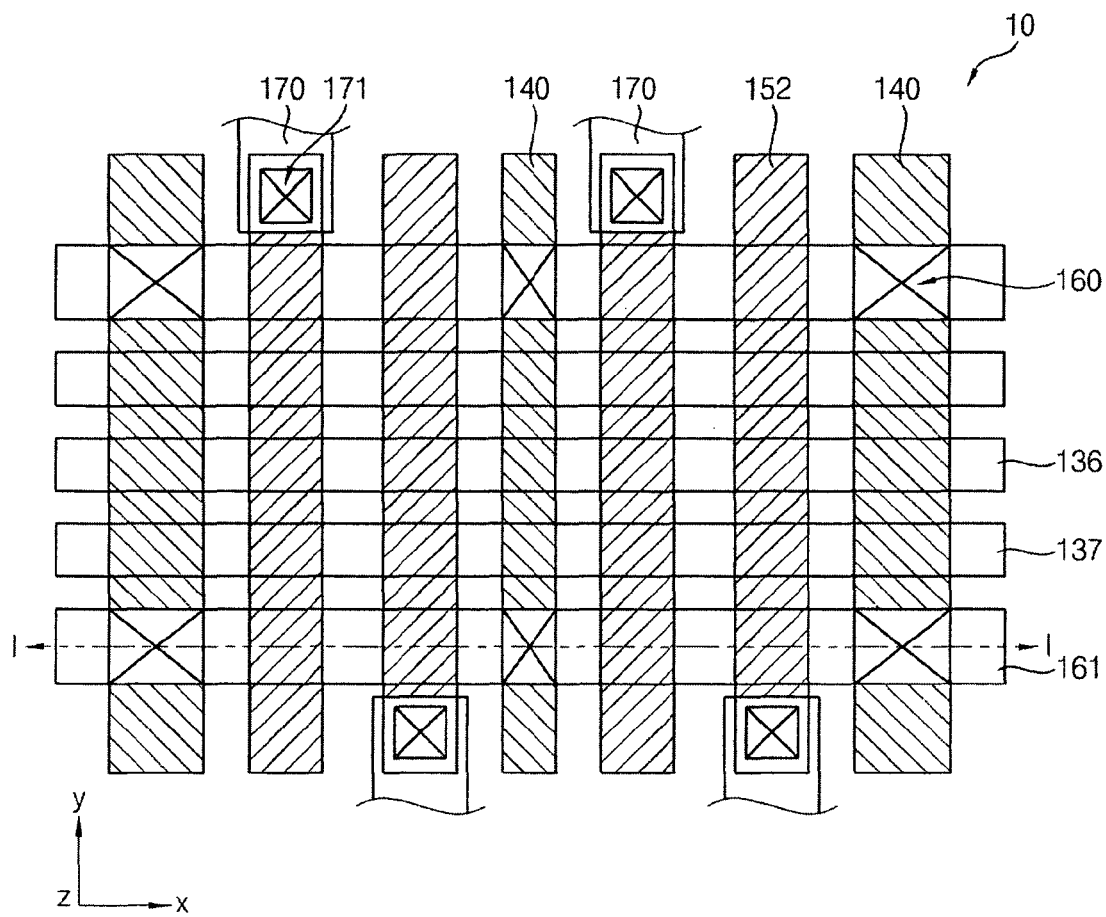
FIG. 1 illustrates a plan view from a top of an exemplary semiconductor device according to an exemplary embodiment.
Figure 2:
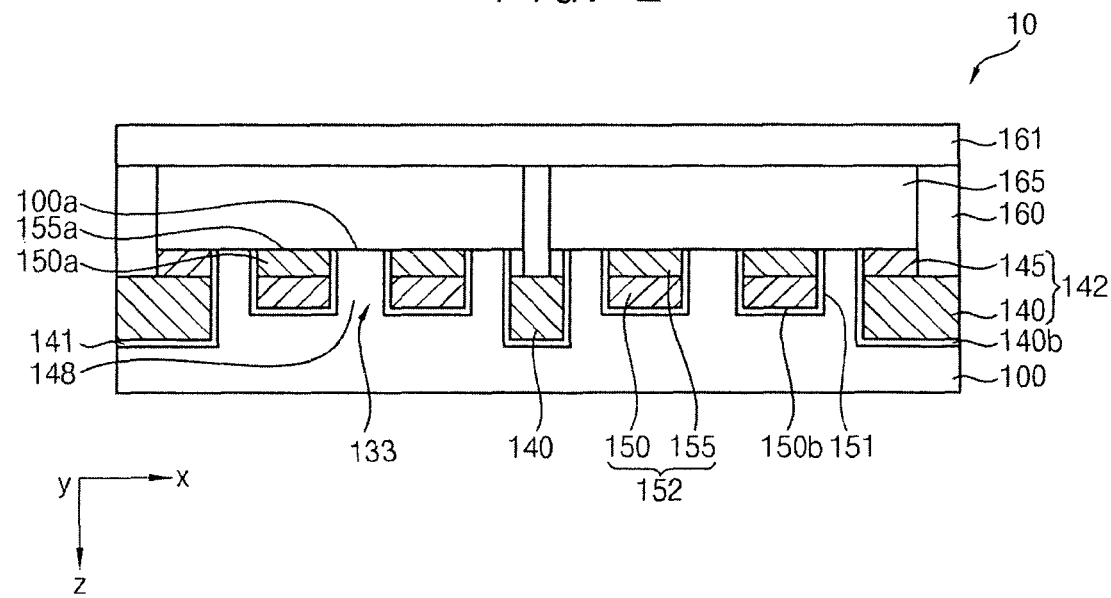
FIG. 2 illustrates an exemplary cross-sectional view of the semiconductor device of FIG. 1 along line I-I of FIG. 1.

FIG. 1 illustrates a plan view from a top of an exemplary semiconductor device 10. FIG. 2 illustrates a cross-sectional view of the semiconductor device 10 of FIG. 1, along line I-I of FIG. 1.

Referring to FIGS. 1 and 2, the semiconductor device 10 may include a semiconductor substrate 100, an isolation 142, an active region 133, an impurity region 148, a cell bit line 136, an isolation contact 160, an isolation control line 161, a buried gate 152, and a first insulating layer 165. Each of the buried gates 152 may include a gate electrode 150 and a capping pattern 155. Each of the isolations 142 may include a first isolation pattern 140 and a second isolation pattern 145. A portion and/or all, e.g., two layers, of the buried gates 152 and the isolations 142 may include one or more same materials and/or may include a same structure, e.g., two stacked layers. The gate electrode 150 may be of a same material as the first isolation pattern 140. The gate electrode 150 and the first isolation pattern 140 may be formed at a same time, e.g., during a same procedure. The capping pattern 155 may be of a same material as the second isolation pattern 145. The capping pattern 155 and the second isolation pattern 145 may be formed at a same time, e.g., during a same procedure.

The buried gates 152 may further include a gate insulating layer 151 between the gate electrode 150 and the semiconductor substrate 100. The isolations 142 may further include an insulating layer 141 between the first isolation pattern 140 and the semiconductor substrate 100. The gate insulating layer 151 and the insulating layer 141 may be a same material. The gate insulating layer 151 and the insulating layer 141 may be formed at a same time, e.g., during a same procedure. The gate insulating layer 151 and the insulating layer 141 may include, e.g., silicon dioxide. Embodiments are not, however, limited to including the gate insulating layer 151 and the insulating layer 141. For example, some embodiments may only include the gate insulating layer 151.

Isolating regions 137 may extend between adjacent ones of the cell bit lines 136 and/or the isolation control lines 161. The isolating regions 137, the cell bit lines 136 and the isolation control lines 161 may extend along a first direction, e.g., an x-direction. The isolating regions 137 may include a substantially and/or completely line type pattern defining line type patterns of the semiconductor substrate 100 where the isolations 142 may further define the active regions 133. The isolations 142 may extend along a second direction, e.g., a y-direction. The first direction may cross the second direction, e.g., may be perpendicular to each other. That is, e.g., the first isolation patterns 140 and the second isolation patterns 145 may at least partially define the active regions 133 on the semiconductor substrate 100. More particularly, portions of respective ones of the isolations 142 and the isolating regions 137 may respectively define the active regions 133 of the semiconductor substrate 100. The active regions 133 may be formed in portions of the semiconductor substrate 100 having a substantially and/or completely line type pattern.

The cell bit lines 136 may extend parallel to the isolation control lines 161. The cell bit lines 136 and the isolation control lines 161 may cross, e.g., be perpendicular to, the capping patterns 155 and the gate electrodes 150. The gate electrodes 150 may be electrically connected by, e.g., contacts 171, to respective word lines 170. The contacts 171 may include conductive material so as to electrically connect the word lines 170 to the respective gate electrodes 150. The word lines 170 may extend along the second direction, e.g., a y-direction. The isolation contacts 160 may include conductive material so as to electrically connect the isolations 142 to the respective isolation control line 161.

The impurity regions 148 may correspond to source/drain regions of a transistor. The impurity regions 148 may be formed by implanting impurity ions into the active region 133. More particularly, impurity ions may be implanted on sides of the buried gates 152. The impurity regions 148 may have a different conductivity type than the semiconductor substrate 100.

Referring to FIG. 2, each of the buried gates 152 may be partially and/or completely below an upper surface 100a of the semiconductor substrate 100. For example, an upper surface 150a of the gate electrode 150 may be completely below the upper surface 100a of the semiconductor substrate 100. In such cases, e.g., an upper surface 155a of the capping pattern 155 may be completely and/or substantially at a same level as the upper surface 100a of the semiconductor substrate 100.

As shown in FIG. 2, a bottom surface 140b of the first isolation pattern 140 may be further from the upper surface 100a of the semiconductor substrate 100 than a bottom surface 150b of the gate electrode 150 of the buried gate 152.

Next, an exemplary method of forming, e.g., the semiconductor device 10 of FIGS. 1 and 2 will be described.

FIGS. 3A, 4A, 5A, 6A, 7A and 8A illustrate plan views from a top of intermediate structures of stages in an exemplary method of forming a semiconductor device. FIGS. 3B, 4B, 5B, 6B 7B and 8B illustrate cross-sectional views of the intermediate structures of FIGS. 3A, 4A, 5A, 6A, 7A and 8A along lines II-II, III-III, IV-IV, V-V, VI-VI and VII-VII, respectively.

Figure 3A:
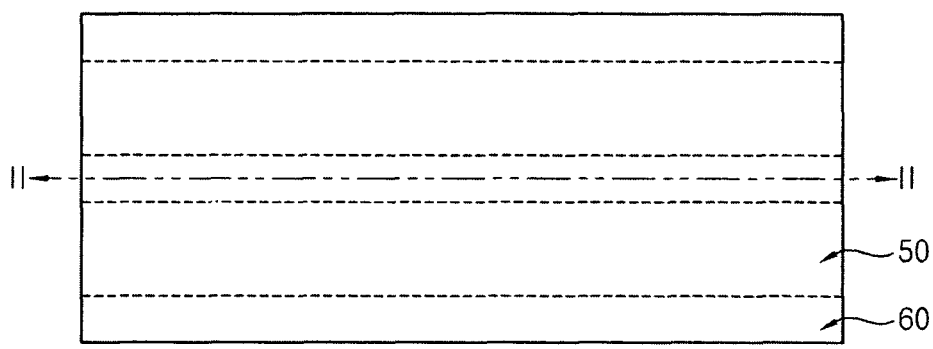
FIGS. 3A, 4A, 5A, 6A, 7A and 8A illustrate plan views from a top of intermediate structures of stages in an exemplary method of forming the semiconductor device of FIG. 1.
Figure 3B:
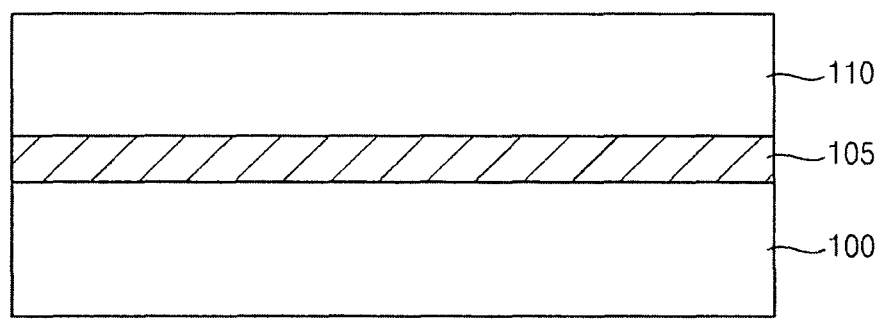
FIGS. 3B, 4B, 5B, 6B 7B and 8B illustrate cross-sectional views of the intermediate structures of FIGS. 3A, 4A, 5A, 6A, 7A and 8A along lines II-II, III-III, IV-IV, V-V, VI-VI and VII-VII, respectively.

Referring to FIGS. 3A and 3B, a semiconductor substrate 100 may be patterned to isolate portions thereof. For example, an upper portion of the semiconductor substrate 100 may be patterned via shallow trench isolation (STI) to include trenches 50 defining isolated regions 60 of the semiconductor substrate 100. The trenches 50 may be formed by etching respective portions of the semiconductor substrate 100. Remaining portions of the semiconductor substrate between adjacent ones of the trenches 50 may correspond to the isolated regions 60 of the semiconductor substrate 100. The semiconductor substrate 100 may be, e.g., a silicon wafer. The trenches 50 may be filled with insulating material, e.g., dielectric material, using, e.g., chemical vapor deposition (CVD). More particularly, e.g., the trenches 50 may be filled with silicon oxide, silicon nitride and/or silicon oxynitride. After filling the trenches 50 with the insulating material, any excess insulating material may be removed, e.g., by planarizing an upper surface of the semiconductor substrate 100. For example, excess insulating material may be removed by performing chemical-mechanical planarization (CMP). The trenches 50 may have a line type pattern such that the isolated regions 60 may also have a line type pattern.

Referring to FIG. 3B, a first patterning layer 105 and a second patterning layer 110 may be formed on the semiconductor substrate 100. The first patterning layer 105 may include a high-k dielectric layer, and more particularly, e.g., a silicon oxide layer, a silicon nitride layer and/or a silicon oxynitride layer, etc. The first patterning layer 105 may be formed using, e.g., CVD. The first patterning layer 105 may have a thickness of, e.g., about 500 Angstroms to about 2000 Angstroms. The second patterning layer 110 may be formed using, e.g., CVD, to a thickness of, e.g., about 2000 Angstroms. The second patterning layer 110 may include, e.g., poly-silicon, oxide, etc.

Figure 4A:
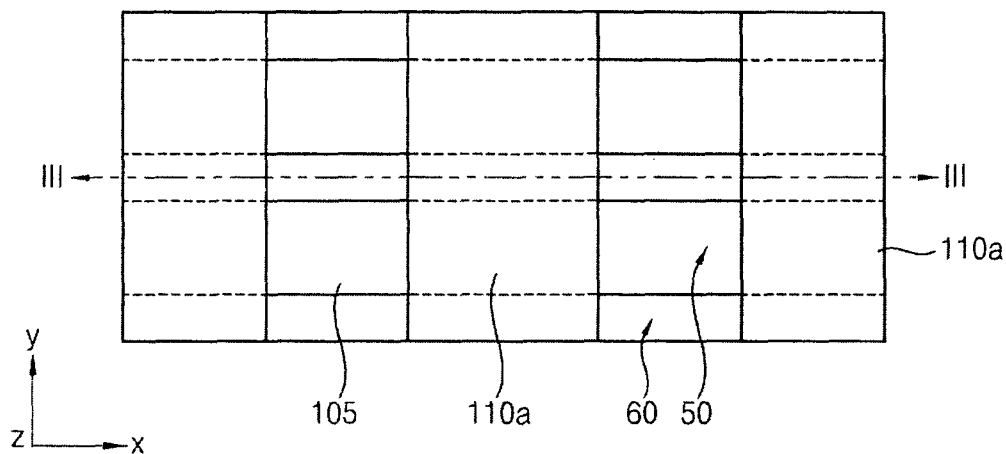
Figure 4B:
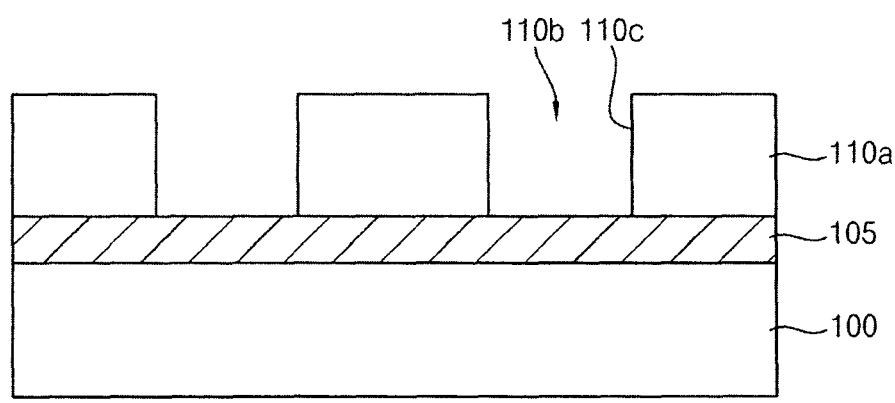

Referring to FIGS. 4A and 4B, the second patterning layer 110 may be patterned to form a second pattern 110a. The second patterning layer 110 may be patterned by, e.g., selectively etching portions of the second patterning layer 110 using a patterned photoresist. The second pattern 110a may expose portions of the first patterning layer 105. The second pattern 110a may be a line type, i.e., striped, pattern defining trenches 110b extending along the second direction, e.g., y-direction. The isolated regions 60 of the semiconductor substrate 100 may extend along the first direction, e.g., x-direction. More particularly, the second pattern 110a may overlap portions of the isolated regions 60 where the isolations 142 (see FIG. 2) may later be formed and may expose portions of the isolated regions 60 where the buried gates 152 (see FIG. 2) may be formed.

Figure 5A:
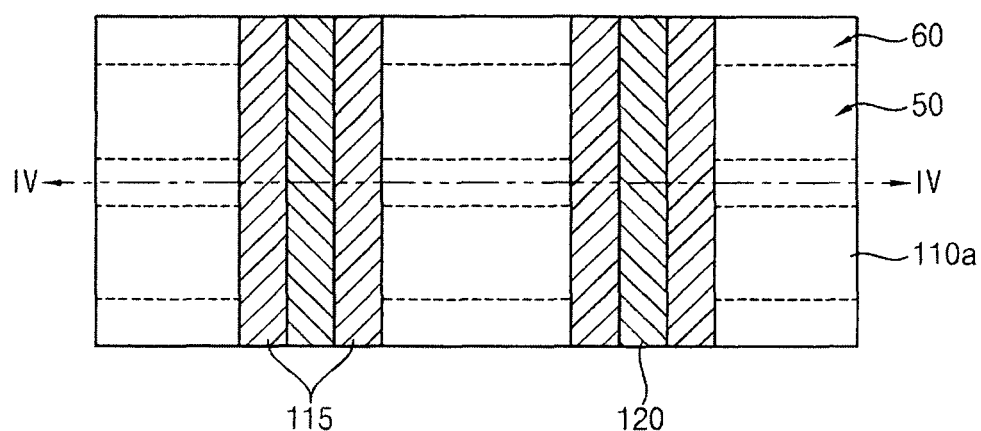
Figure 5B:
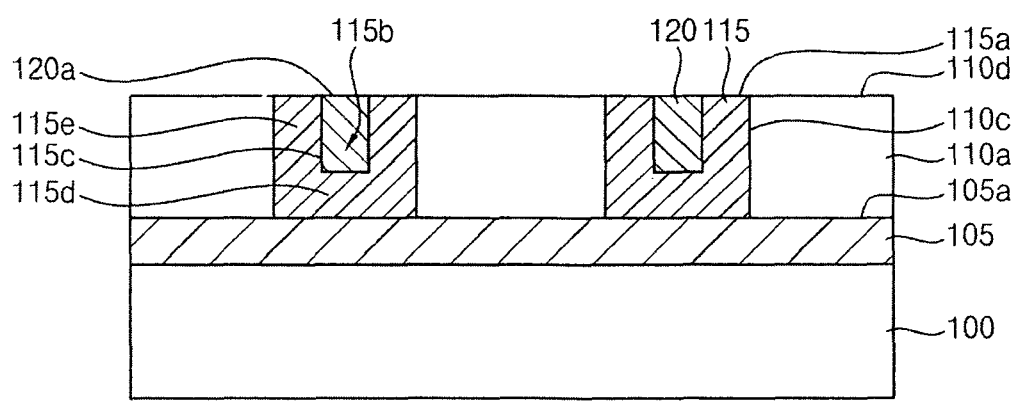

Referring to FIGS. 5A and 5B, a third patterning layer 115 and a fourth patterning layer 120 may be formed on the semiconductor substrate 100. The third patterning layer 115 and the fourth patterning layer 120 may have different etch rates. The third patterning layer 115 may include, e.g., oxide, poly-silicon, etc. More particularly, e.g., in embodiments in which the second patterning layer 110 includes poly-silicon, the third patterning layer 115 may include oxide, e.g., middle temperature oxide, and, in embodiments in which the second patterning layer 110 includes oxide, the third patterning layer 115 may include poly-silicon. The fourth patterning layer 120 may be, e.g., an etch stop layer and may include, e.g., nitride.

The third patterning layer 115 and the fourth patterning layer 120 may be conformally formed in the trenches 110b defined by the second pattern 110a. The third patterning layer 115 and the fourth patterning layer 120 may together completely and/or substantially fill the trenches 110b defined by the second pattern 110a.

More particularly, e.g., the third patterning layer 115 may cover, e.g., completely cover, an upper surface 105a of the first patterning layer 105 exposed by the trenches 110b and may cover, e.g., substantially and/or completely cover, sidewalls 110c of the second pattern 110a. Upper surfaces 115a of the third patterning layer 105 may extend along a same and/or substantially same plane as upper surfaces 110d of the second pattern 110a. The third patterning layer 115 may not completely fill the trenches 110b. That is, the third patterning layer 115 may be conformally formed in the respective trenches 110b such that trenches 115b, smaller than the respective trenches 110b, may be defined by the third patterning layer 115. Sidewalls 115c of the third patterning layer 115 may substantially correspond to the sidewalls 110c (see FIG. 4B) of the second pattern 110a. The third patterning layer 115 may have a substantially U-shaped structure including a base portion 115d and columnar portions 115e. The base portion 115d may substantially extend along a plane parallel to a plane along which the semiconductor substrate 100 extends. The columnar portions 115e may substantially extend along a direction crossing, e.g., perpendicular to, a plane along which the semiconductor substrate 100 extends. There may be a space between adjacent ones of the columnar portions 115e not connected by the base portion 115d and such a space may be filled by, e.g., respective portions of the second pattern 110a.

The fourth patterning layer 120 may be formed on the third patterning layer 115 and may partially and/or completely fill trenches 115b defined by the third patterning layer 115. The upper surfaces 115a of the third patterning layer 115 and upper surfaces 120a of the fourth patterning layer 120 may extend along a same and/or substantially same plane as a result of performing etchback, CMP, etc., on an upper surface of an intermediate structure resulting after formation of the third patterning layer 115 and the fourth patterning layer 120 on the exemplary structure of FIGS. 4A and 4B. The columnar portions 115e of the third patterning layer 115 may extend below, e.g., directly below, the upper surfaces 115a of the third patterning layer 115 exposed after performing CMP.

Figure 6A:
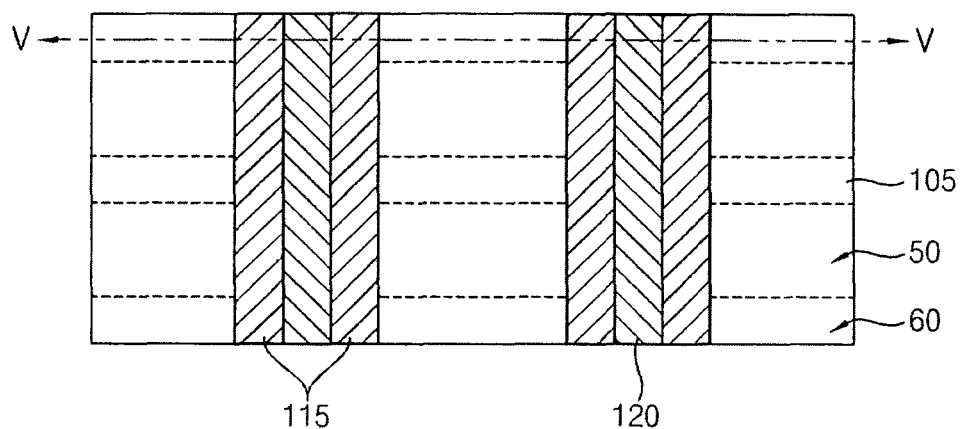
Figure 6B:
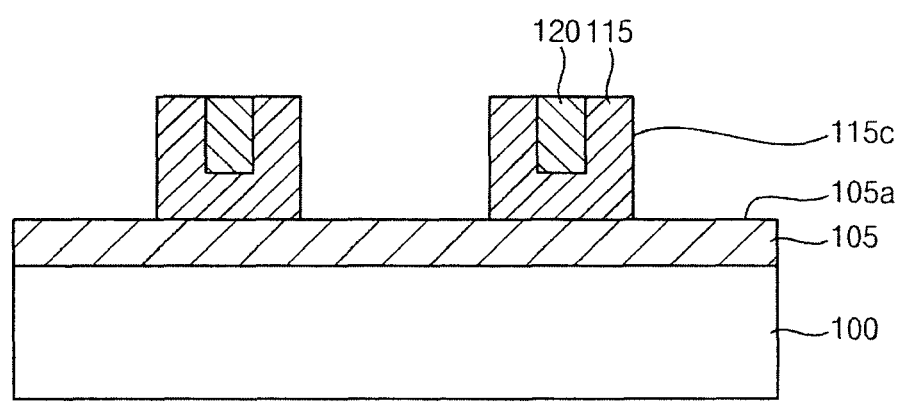

Referring to FIGS. 6A and 6B, the second pattern 110a may be removed. For example, the second pattern 110a may be removed using a wet etching or a dry etching process. The second pattern 110a may be removed to expose portions of the first patterning layer 105. More particularly, by removing the second pattern 110a, portions of the first patterning layer 105 between adjacent ones of the third patterning layer 115 may be exposed. Further, by removing the second pattern 110a, the sidewalls 115c of the third patterning layer 115 may be exposed.

Figure 7A:
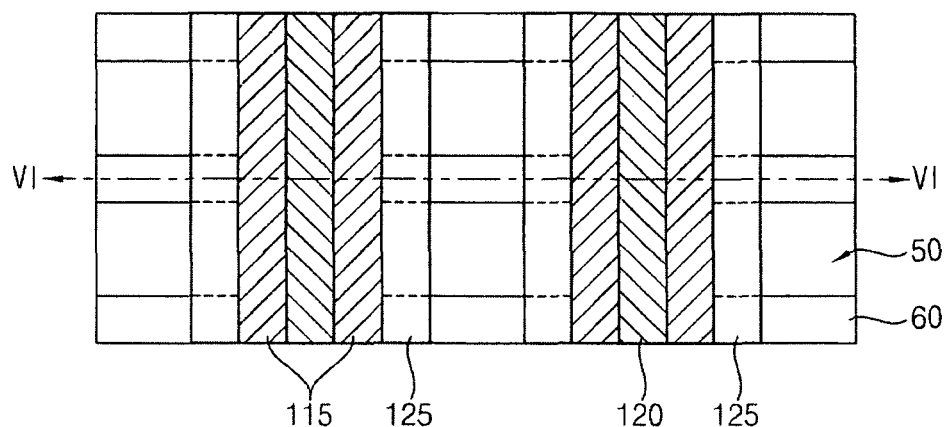
Figure 7B:
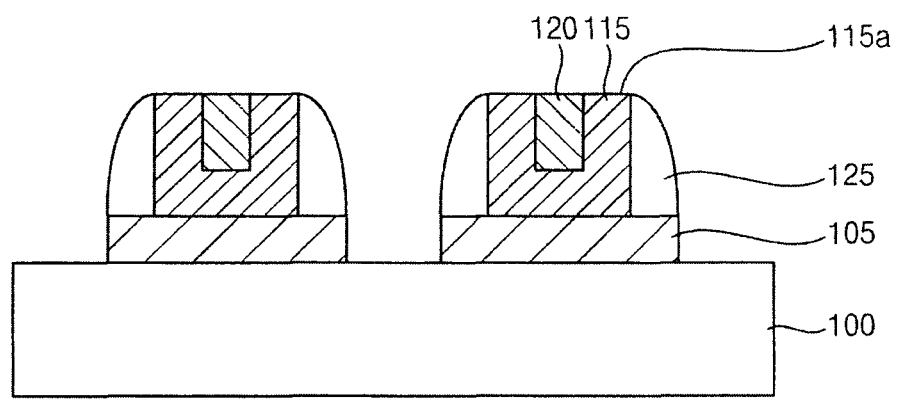

Referring to FIGS. 7A and 7B, spacers 125 may be formed on the exposed sidewalls 115c of the third patterning layer 115. The spacers 125 may be formed by forming a spacer forming material (not shown) on the semiconductor substrate 100. The spacer forming material may be anisotropically etched to form the spacers 125. The spacer forming material may have an etch rate that is different from the etch rate of the third patterning layer 115. The spacer forming material may have an etch rate that is same and/or substantially same as an etch rate of the fourth patterning layer 120. More particularly, the spacer forming material and/or the fourth patterning layer 120 may have a slower etch rate than the third patterning layer 115, the first patterning layer 105, and/or the semiconductor substrate 100. That is, the fourth patterning layer 120 and the spacers 125 may function as an etch stop.

While forming the spacers 125, portions of the semiconductor substrate 100 may also be exposed. That is, e.g., portions of the first patterning layer 105 may be removed to expose portions of the semiconductor substrate 100 during formation of the spacers 125. More particularly, portions of the first patterning layer 105 between adjacent ones of the spacers 125 may be removed to so as to expose portions of the semiconductor substrate 100 between adjacent ones of the spacers 125. The spacers 125 may be a same material as the fourth patterning layer 120. For example, the spacers 125 and/or the fourth patterning layer 120 may include nitride.

Figure 8A:
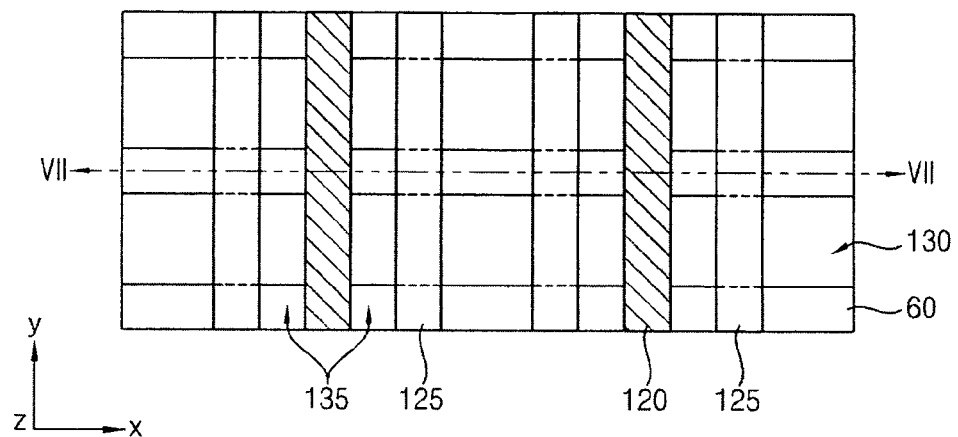
Figure 8B:
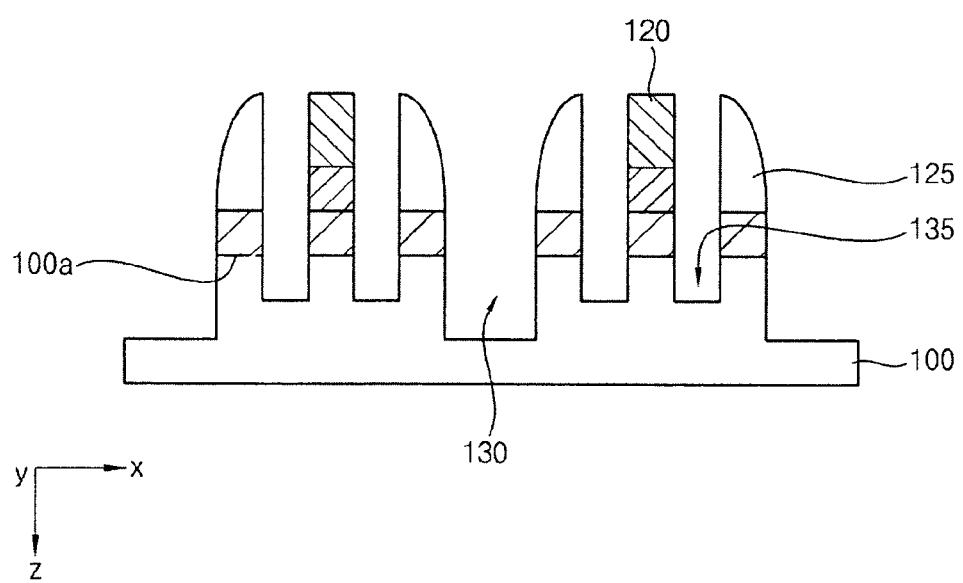

Referring to FIGS. 8A and 8B, in embodiments, e.g., portions of the semiconductor substrate 100 may be removed based on, e.g., portions of the intermediate structure shown in FIGS. 7A and 7B. More particularly, e.g., portions of the semiconductor substrate 100 may be removed to form isolation trenches 130 and gate trenches 135. The isolation trenches 130 and the gate trenches 135 may be substantially simultaneously and/or simultaneously formed, i.e., during a same process.

In embodiments, e.g., the isolation trenches 130 and the gate trenches 135 may be simultaneously formed by removing portions of the semiconductor substrate 100 not covered by an etch stop, e.g., the spacers 125 and/or the fourth patterning layer 120, by etching. More particularly, in embodiments, e.g., the isolation trenches 130 and the gate trenches 135 may be simultaneously formed by etching portions of the semiconductor substrate 100 exposed by the spacers 125 and/or portions of the semiconductor substrate 100 overlapping with the columnar portions 115e of the third patterning layer 115. For example, portions of the semiconductor substrate 100 below, e.g., substantially and/or completely directly below, the upper surfaces 115a of the third patterning layer may be simultaneously etched while portions of the semiconductor substrate 100 that are exposed by the spacers 125, e.g., between adjacent spacers 125, are etched. More particularly, e.g., in embodiments, portions of the semiconductor substrate 100 may be etched such that portions that are covered by a material having a relatively faster etch rate may be removed while other portions that are covered by a material having a relatively slower etch rate, e.g., etch stop material, may be maintained.

The isolation trenches 130 and the gate trenches 135 may extend along a third direction, e.g., a z-direction. The third direction may cross, e.g., be perpendicular to, each of the first and/or the second directions. The isolation trenches 130 and the gate trenches 135 may each have a predetermined depth along the third direction relative to the upper surface 100a of the semiconductor substrate 100. The depth of the isolation trenches 130 may be deeper than the depth of the gate trenches 135 relative to the upper surface 100a of the semiconductor substrate 100.

Referring to FIGS. 1, 2 and 8B, after forming the isolation trenches 130 and the gate trenches 135, remaining layers and/or layer portions on the semiconductor substrate 100 may be removed. More particularly, e.g., after forming the isolation trenches 130 and the gate trenches 135, remaining layers and/or layer portions on the semiconductor substrate 100 may be removed so as to completely expose the upper surface 100a of the semiconductor substrate 100. For example, any remaining portion of the spacers 125, the fourth patterning layer 120, the third patterning layer 115 and the first patterning layer 105 may be removed. After removing the remaining portions of the layers, the upper surface 100a of the semiconductor substrate 100 may be cleaned.

Referring to FIGS. 2 and 8B, the gate insulating layer 151 may be formed in the gate trenches 135 and/or the insulating layer 141 may be formed in the isolation trenches 130 of the semiconductor substrate 100. The gate insulating layer 151 and the insulating layer 141 may be formed, e.g., during a same process.

The gate electrodes 150 and/or the first isolation patterns 140 may be formed, e.g., by depositing a conductive material, e.g., a metal, TiN, etc., in the gate trenches 135 and/or the isolation trenches 130. After depositing the conductive material, an etchback process may be performed to form the gate electrode 150 and/or the first isolation pattern 140. The gate electrodes 150 and the first isolation patterns 140 may be formed, e.g., during a same process.

Referring still to FIGS. 2 and 8B, the capping patterns 155 and/or the second isolation patterns 145 may be formed by, e.g., depositing, a capping material, e.g., SiN, etc., on the gate electrodes 150 and/or the first isolation patterns 140, respectively. The second isolation patterns 145 and the capping patterns 155 may be formed, e.g., during a same process. After depositing the capping material, an etchback process, CMP, etc. may be performed to remove the excess capping material and form the capping patterns 155 and/or the second isolation patterns 145.

The impurity regions 148, e.g., source/drain regions, may be formed by implanting impurity ions into the active region 133 on sides of the buried gates 152.

In embodiments, to further ensure that the isolations 142 are adapted to function as isolations separating different active regions 133 of the semiconductor substrate 100, the isolations 142 may be electrically connected together via, e.g., isolation contacts 160 and the isolation control lines 161. To form the isolation contacts, selective portions of the first insulating layer 165 and the second isolation patterns 145 may be removed to expose portions of the first isolation patterns 140, and material for forming the isolation contacts 160 may be arranged, e.g., within spaces defined by the removed portions of the second isolation patterns 145 and/or the first insulating layer 165 on the first isolation patterns 140, respectively.

Figure 9:
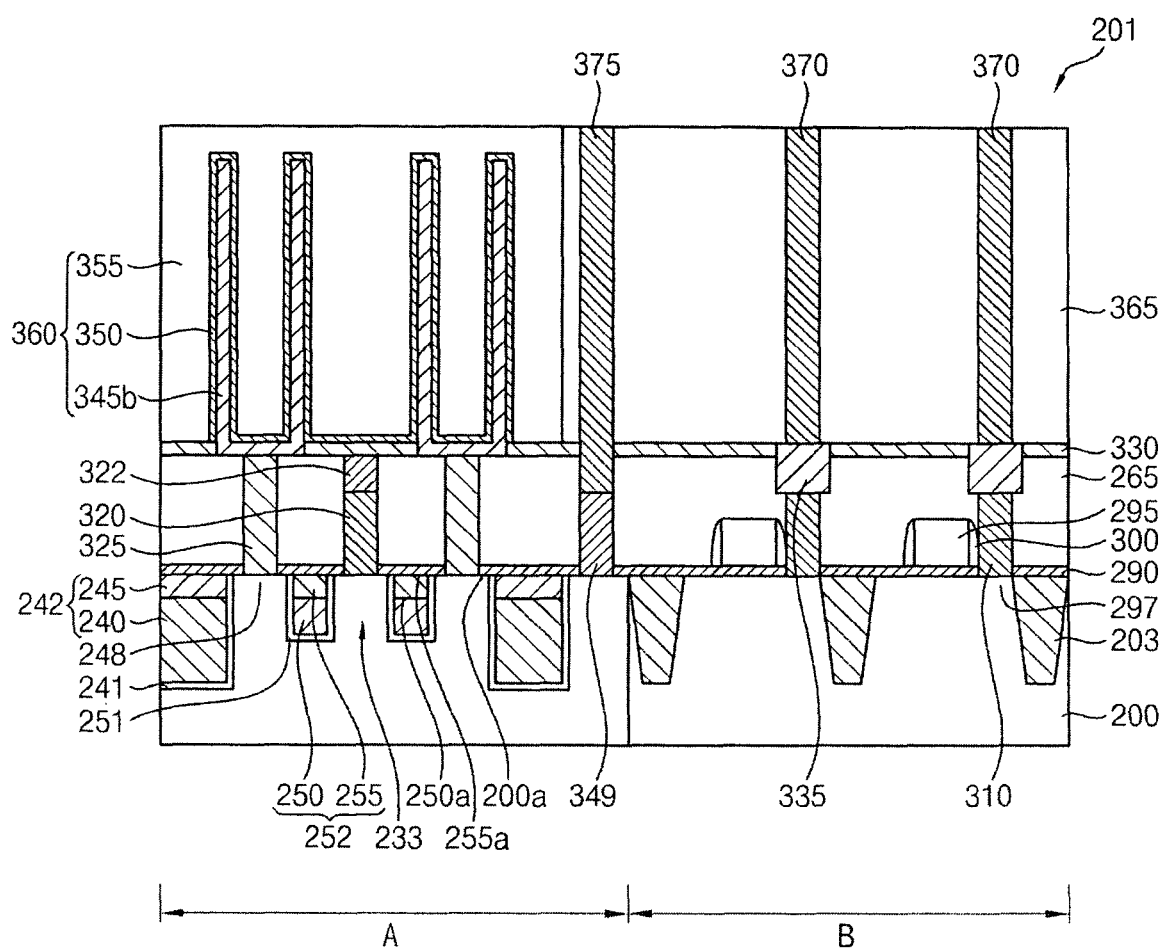
FIG. 9 illustrates a cross-sectional view of an exemplary memory device according to an exemplary embodiment.

FIG. 9 illustrates a cross-sectional view of an exemplary embodiment of a memory device 201. In the following description, reference numerals similar to those used to describe the exemplary embodiments in FIGS. 1-8B correspond to like features. Thus, a detailed description thereof may not be repeated. For example, in the description of FIG. 1, reference numeral 142 corresponds to isolation regions, in the description below of FIG. 9, reference numeral 242 corresponds to isolation regions, which may have the same features of the isolation regions 142 described above.

Referring to FIG. 9, the memory device 201 may be a dynamic random access memory (DRAM) device. The memory device 201 may include a semiconductor substrate 200 that includes a cell region (region A) and a peripheral region (region B).

On the cell region (region A), the memory device 201 may include isolations 242 and buried gates 252. The isolations 242 may define an active region 233. The buried gates 252 may be formed in the active region 233. The isolations 242 may include a first isolation pattern 240 and a second isolation pattern 245. The buried gates 252 may include a gate electrode 250 and a capping pattern 255. The gate electrode 250 may include a same material as the first isolation pattern 240. The gate electrode 250 and the first isolation pattern 240 may be formed at a same time, e.g., during a same procedure. The capping pattern 255 may include a same material as the second isolation pattern 245. The capping pattern 255 and the second isolation pattern 245 may be formed at a same time, e.g., during a same procedure. That is, e.g., the gate electrode 250 may be of a same material as the first isolation pattern 240, and the capping pattern 255 may be of a same material as the second isolation pattern 245.

The buried gates 252 may further include a gate insulating layer 251 between the gate electrode 250 and the semiconductor substrate 200. The isolations 242 may further include an insulating layer 241 between the first isolation pattern 240 and the semiconductor substrate 200. The gate insulating layer 251 and the insulating layer 241 may include a same material. The gate insulating layer 251 and the insulating layer 241 may be formed at a same time, e.g., during a same procedure. The gate insulating layer 251 and the insulating layer 241 may include, e.g., silicon dioxide.

Referring to FIG. 9, some or all of the buried gates 252 may be below an upper surface 200a of the semiconductor substrate 200. For example, an upper surface 250a of the gate electrode 250 may be completely below the upper surface 200a of the semiconductor substrate 200. In such cases, e.g., an upper surface 255a of the capping pattern 255 may be completely and/or substantially at a same level as the upper surface 200a of the semiconductor substrate 200.

The memory device 201 may further include a gate insulating layer 290, a first insulating layer 265, a first conductive pattern 320, a second capping pattern 322, a second conductive pattern 325, an etch stop layer 330 and a charge storage element 360 on the cell region (region A).

The gate insulating layer 290 may include, e.g., silicon oxide. The gate insulating layer 290 may be formed on the semiconductor substrate 200. The first insulating layer 265 may be formed on the gate insulating layer 290. The first insulating layer 265 may include, e.g., an oxide having a thickness along the third direction, e.g., z-direction, of about 1000 Angstroms to about 3000 Angstroms.

The etch stop layer 330 may be formed on the first insulating layer 265. The etch stop layer 330 may include, e.g., nitride having a thickness of about 200 Angstroms to about 500 Angstroms along the third direction, e.g., z-direction.

The first conductive pattern 320 and the second capping pattern 322 may together extend through the first insulating layer 265 along the third direction, e.g., z-direction. The second conductive pattern 325 may extend through the first insulating layer 265 along the third direction, e.g., z-direction. The charge storage elements 360 may be electrically connected to respective ones of the second conductive patterns 325.

Each of the charge storage elements 360 may include a lower electrode 345, an insulating film 350 and an upper electrode 355. The lower electrode 345 may include a conductive material such as, e.g., Al, TiN, Ti, TaN, Pt, Ir, W, Au, etc. The insulating film 350 may include a high dielectric layer. More particularly, the insulating film 350 may include, e.g., an oxide and/or a nitride of at least one metal such as Ta, Hf, Nb, Zr and Al. For example, the insulating film may include, $ZrO_2$, $Al_2O_3$, ZrOCN, "ZAZ", e.g., $ZrO_2$—$Al_2O_3$—

ZrO$_2$, "ZAT", Hf$_2$O$_3$, etc. The upper electrode 355 may include a conductive material such as, e.g., Al, TiN, Ti, TaN, Pt, Ir, W, Au, etc.

On the peripheral region (region B), the memory device 201 may include peripheral isolations 203, the gate insulating layer 290, the etch stop layer 330, peripheral gate electrodes 295, peripheral impurity regions 297, peripheral gate spacers 300, a peripheral first conductive pattern 310, a peripheral second conductive layer 335 and the first insulating layer 265, second insulating layer 365 and metal patterns 370.

The peripheral isolations 203 may be formed using, e.g., conventional STI. The gate insulating layer 290 may include, e.g., an oxide such as silicon oxide. The etch stop layer 330 may include, e.g., nitride. The peripheral gate electrodes 295 may include, e.g., poly-silicon. The peripheral gate spacers 300 may include, e.g., silicon nitride.

The peripheral impurity regions 297, e.g., source/drain regions, may be formed by implanting impurity ions into the semiconductor substrate 200 on sides of the peripheral gate spacers 300. The peripheral first conductive pattern 310 may include, e.g., a metal. The peripheral second conductive layer 335 may be formed using, e.g., a damascene process, and may include, e.g., copper. The second insulating layer 365 may include oxide, e.g., high density plasma (HDP) oxide, phosphorous doped tetra-ethyl ortho-silicate (PTEOS) oxide.

The device 201 may further include a third conductive pattern 349 and a second metal pattern 375. As shown in FIG. 9, at a region between the cell region (region A) and the peripheral region (region B), the third conductive pattern 349 may be arranged on and/or between, e.g., adjacent ones of the isolations 242 and the peripheral isolations 203. The second metal patterns 375 may extend through the second insulation layer 365, the etch stop layer 330 and/or the first insulating layer 265. The second metal patterns 375 may be of a same material as the metal patterns 370.

FIGS. 10, 11, 12, 13, 14, 15, 16, 17, 18, 19, 20, 21, 22 and 23 illustrate cross-sectional views of intermediate structures of stages in an exemplary method of forming the exemplary memory device 201 of FIG. 9. In general, only differences between the exemplary method illustrated in FIGS. 10 through 23 and the exemplary method illustrated in FIGS. 3A through 8B will be described below, and like reference numerals correspond to like features.

Figure 10:
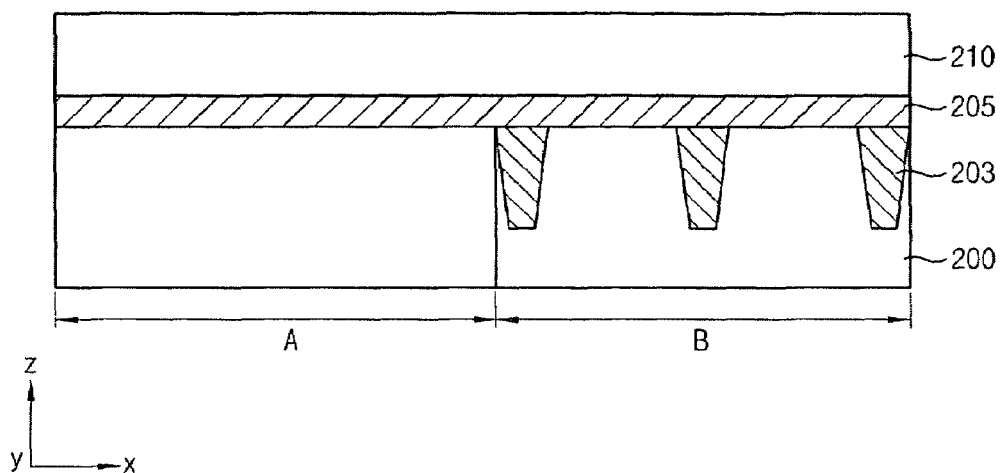
FIGS. 10, 11, 12, 13, 14, 15, 16, 17, 18, 19, 20, 21, 22 and 23 illustrate cross-sectional views of intermediate structures of stages employable in an exemplary method of forming the exemplary memory device of FIG. 9.

Referring to FIG. 10, the peripheral isolations 203 may be formed in the peripheral region (region B) using, e.g., conventional STI. Referring to FIGS. 1 and 10, in embodiments, the peripheral isolations 203 may be formed at a same time and process as forming the isolation regions 137 between, e.g., respective ones of the cell bit lines 136.

A first patterning layer 205 and a second patterning layer 210 may be formed on the semiconductor substrate 200. In embodiments, e.g., the first patterning layer 205 and the second patterning layer 210 may be formed on the cell region (region A) and the peripheral region (region B).

Figure 11:
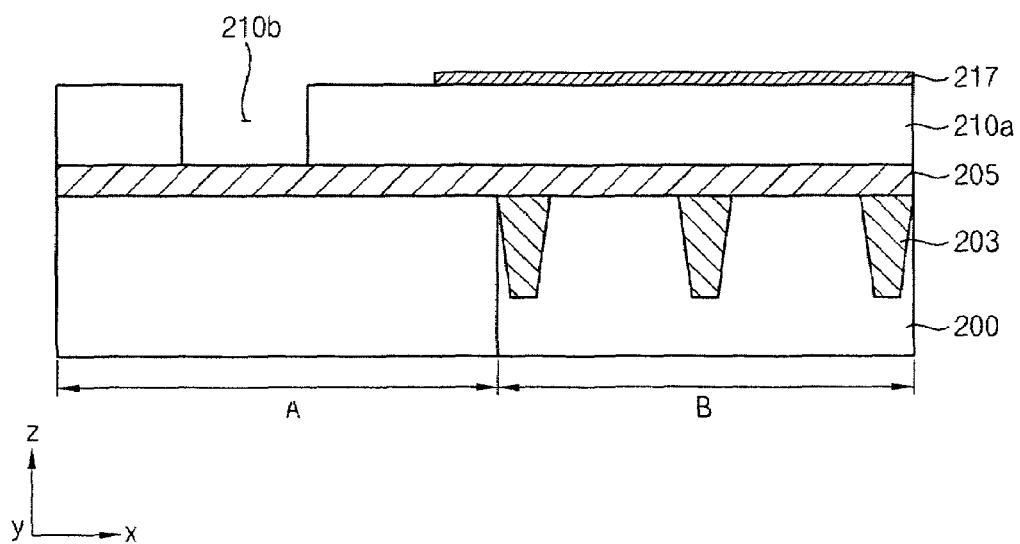

Referring to FIG. 11, a peripheral etch stop layer 217 may be formed on the second patterning layer 210 in the peripheral region (region B). The peripheral etch stop layer 217 may include, e.g., nitride and may have a height along the third direction, e.g., z-direction, of about 200 Angstroms to about 500 Angstroms. A second pattern 210a may be formed by forming trenches 210b in the second patterning layer 210.

Figure 12:
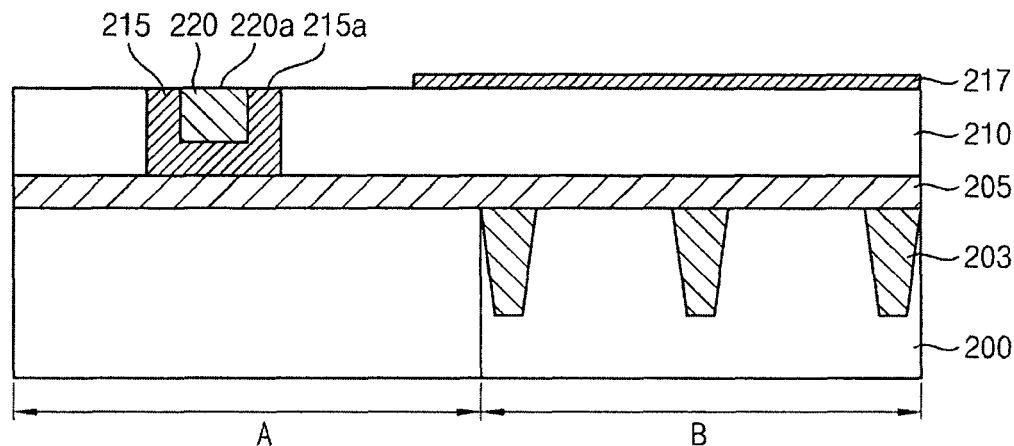

Referring to FIG. 12, a third patterning layer 215 and a fourth patterning layer 220 may be formed on the semiconductor substrate 200. More particularly, the third patterning layer 215 and the fourth patterning layer 220 may be conformally formed so as to fill the trenches 210b. The third patterning layer 215 may have a different etch rate than the fourth patterning layer 220. For example, one of the third patterning layer 215 and the fourth patterning layer 220 may include, e.g., an oxide layer, and the other of the third patterning layer 215 and the fourth patterning layer 220 may include, e.g., poly-silicon. CMP, etchback, etc. may be performed to planarize upper surfaces 215a, 220a of the third patterning layer 215 and the fourth patterning layer 220, respectively.

Figure 13:
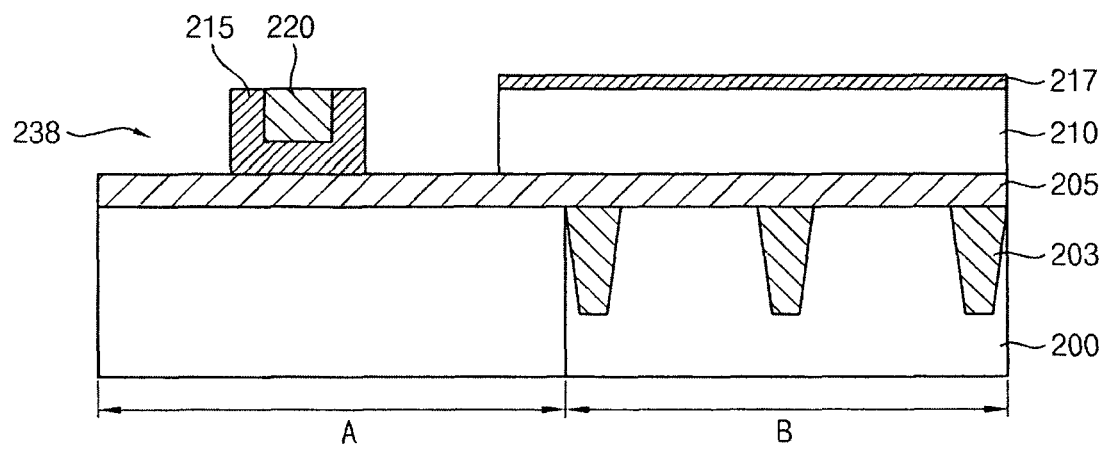

Referring to FIG. 13, the second patterning layer 210 may be selectively etched in the cell region (region A), i.e., portions of the second patterning layer 210 not covered by the peripheral etch stop 217 may be removed using, e.g., a dry etch, to expose respective portions of the first patterning layer 205. The second patterning layer 210 may define openings 238.

Figure 14:
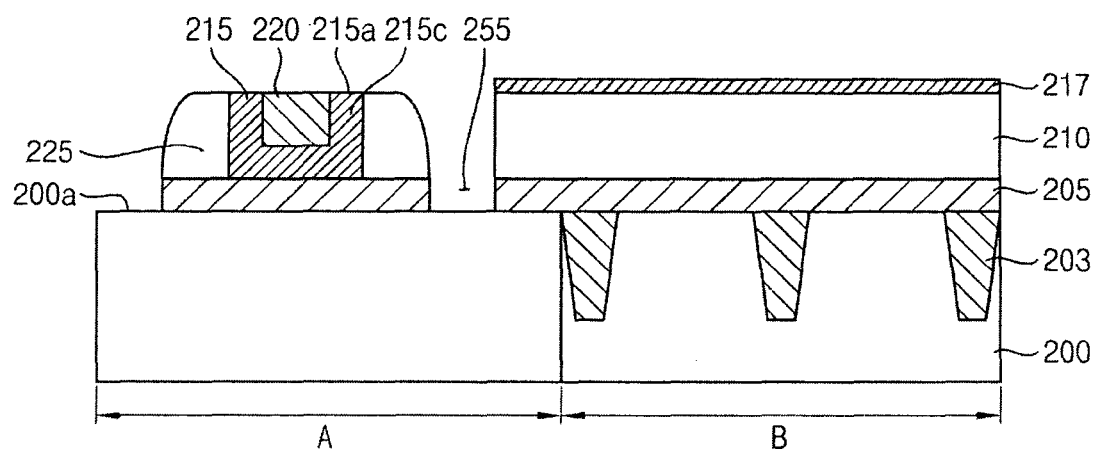

Referring to FIG. 14, spacers 225 may be formed by depositing and anisotropically etching a spacer forming layer (not shown) on the semiconductor substrate 200. The spacer forming layer may include a same material as the fourth patterning layer 220. Portions of an upper surface 200a of the semiconductor substrate 200 may be exposed by the spacers 225.

Figure 15:
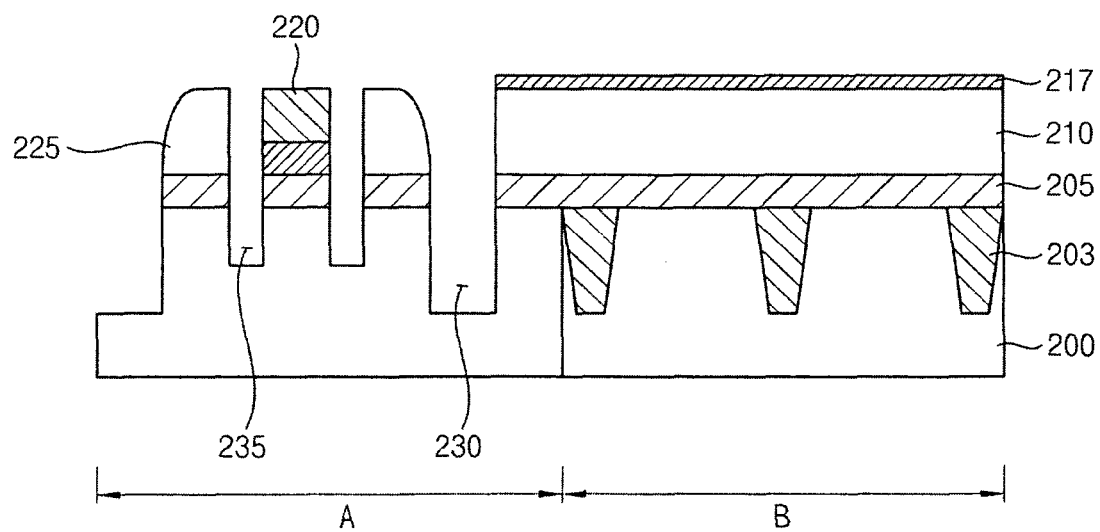

Referring to FIG. 15, isolation trenches 230 and gate trenches 235 may be simultaneously formed in the cell region (region A) by selectively etching the semiconductor substrate 200. More particularly, in embodiments, e.g., the isolation trenches 230 and the gate trenches 235 may be simultaneously formed by etching portions of the semiconductor substrate 200 exposed by the spacers 225 and portions of the semiconductor substrate 200 overlapping with columnar portions 215c of the third patterning layer 215. For example, portions of the semiconductor substrate 200 below, e.g., directly below, the upper surfaces 215a of the third patterning layer exposed after CMP, etchback, etc. and/or that extend along a same and/or substantially same plane as the upper surface 220a of the fourth patterning layer, may be simultaneously etched while portions of the semiconductor substrate 200 that are exposed by the spacers 225, e.g., between adjacent spacers 225, are being etched. More particularly, e.g., portions of the semiconductor substrate 200 overlapped with, e.g., the peripheral etch stop 217, the fourth patterning layer 220, the spacers 225 and/or other etch blocking layer(s), e.g., a nitride layer, may be selectively etched to simultaneously form the isolation trenches 230 and the gate trenches 235.

Figure 16:
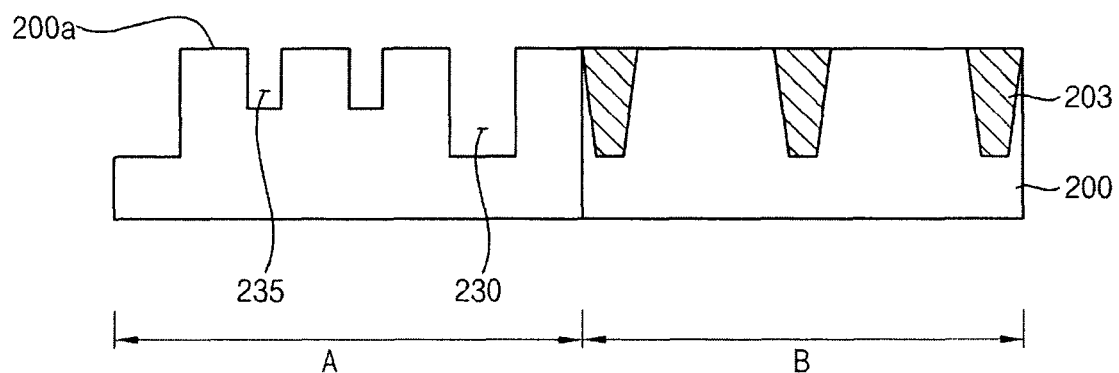

Referring to FIG. 16, remaining layers above the upper surface 200a of the semiconductor substrate 200 may then be removed, e.g., etched. More particularly, e.g., remaining portions of the first patterning layer 205, the second patterning layer 210, the third patterning layer 215, the fourth patterning layer 220, the spacers 225, the peripheral etch stop 217 may all be etched so as to expose the upper surface 200a of the semiconductor substrate 200 including the isolation trenches 230 and the gate trenches 235. The upper surface 200a of the semiconductor substrate 200 may be completely exposed. The upper surface 200a of the semiconductor substrate 200 may be cleaned. The isolation trenches 230 and the gate trenches 235 may completely extend below the upper surface 200a of the semiconductor substrate 200.

Figure 17:
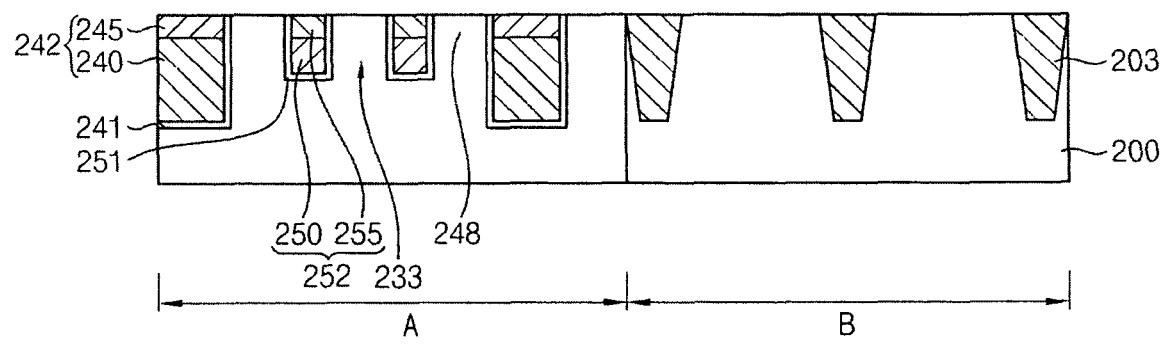

Referring to FIG. 17, the insulating layer 241 and/or the gate insulating layer 251 may then be formed in the isolation trenches 230 and/or the gate trenches 235, respectively. The gate electrodes 250 and the first isolation patterns 240 may be formed, e.g., by depositing a conductive material, e.g., a metal such as TiN, etc., in the isolation trenches 230 and gate trenches 235. After depositing the conductive material, an etchback process may be performed to form the gate electrode 250 and the first isolation pattern 240. The gate electrodes 250 and the first isolation patterns 240 may be partially and/or completely formed simultaneously during a same process.

Referring still to FIG. 17, the capping patterns 255 and the second isolation patterns 245 may be formed by, e.g., depositing, a capping material, e.g., SiN, etc., on the gate electrodes 250 and the first isolation patterns 240, respectively, during a same process. After depositing the capping material, an etchback process, CMP, etc. may be performed to form the capping patterns 255 and the second isolation patterns 245. The impurity regions 248, e.g., source/drain regions, may be formed by implanting impurity ions into the active region 233 on sides of the buried gates 252.

Figure 18:
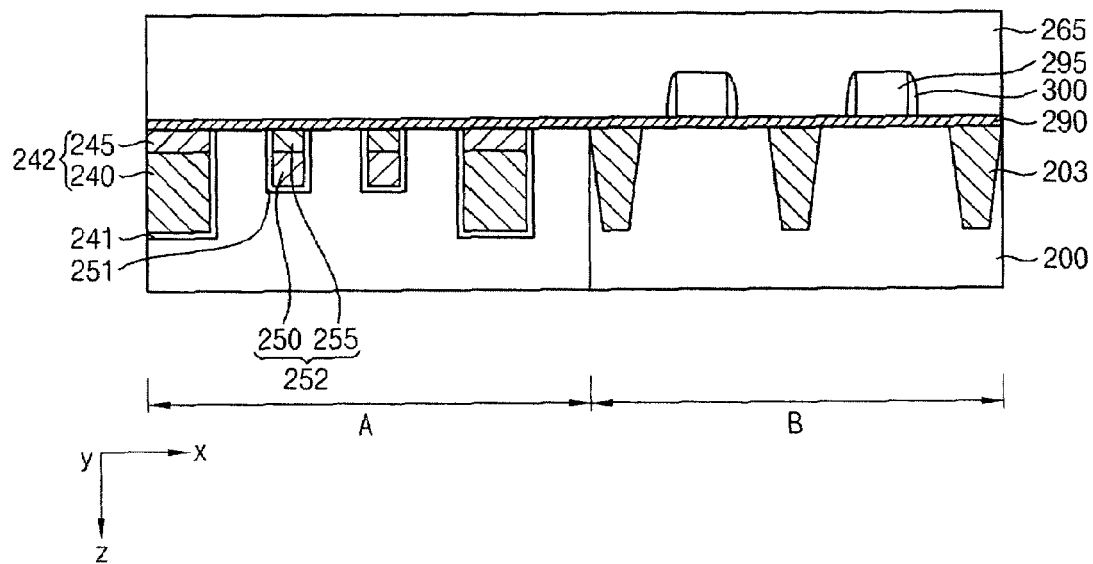

Referring to FIG. 18, the gate insulating layer 290, e.g., an oxide layer, may be formed on the semiconductor substrate 200. The gate insulating layer 290 may be formed on the cell region (region A) and the peripheral region (region B) of the semiconductor substrate 200. The peripheral gate electrode 295, the peripheral gate spacers 300 and the peripheral impurity regions 297 may be formed on the gate insulating layer 290. The first insulating film 265 may be formed on the peripheral gate electrodes 295. The first insulating film 265 may be formed on the cell region (region A) and the peripheral region (region B). The first insulating film 265 may include, e.g., oxide having a thickness along the third direction, e.g., z-direction, of about 1000 Angstroms to about 3000 Angstroms. The first insulating film 265 may be formed using, e.g., CVD, followed by CMP, etchback, etc.

Figure 19:
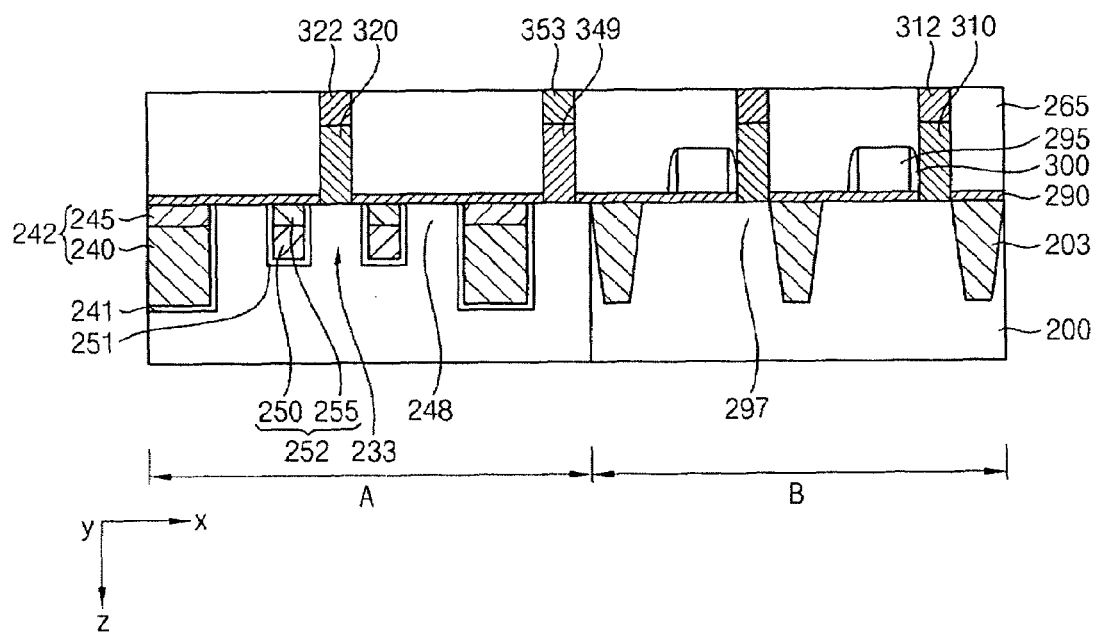

Referring to FIG. 19, the first insulating film 265 and the gate insulating layer 290 may then be patterned to expose respective portions of the semiconductor substrate 200. The peripheral first conductive pattern 310, the first conductive pattern 320 and the third conductive patterns 349 may then be formed by depositing a conductive material, e.g., metal, over the semiconductor substrate 200 so as to cover the exposed portions of the semiconductor substrate 200. After depositing the conductive material, an etchback may be performed to form the peripheral first conductive patterns 310, the first conductive patterns 320 and the third conductive patterns 349.

Each of the peripheral first conductive patterns 310 may be formed on the semiconductor substrate 200 on a respective one of the peripheral impurity regions 297 in the peripheral region (region B), so as to be in electrical contact with the respective one of the peripheral impurity regions 297. Each of the first conductive patterns 320 may formed on the semiconductor substrate 200 on a respective one of the impurity regions 248 in the cell region (region A). For example, the first conductive patterns 320 may be formed to be electrically connected to one of the impurity regions 248 that is common between two adjacent ones of the buried gates 252, i.e., source/drain region that is common to two adjacent transistors on the semiconductor substrate 200. More particularly, e.g., the first conductive patterns 320 may be formed on the respective impurity region 248 so as to be electrically connected thereto. The third conductive pattern 349 may be formed to be electrically connected to the semiconductor substrate 200 adjacent to and/or on respective ones of the isolations 242 and/or the peripheral isolations 203. For example, the third conductive pattern 349 may be formed on a respective portion of the semiconductor substrate 200 between one of the isolations 242 and one of the peripheral isolations 203.

The peripheral first conductive pattern 310, the first conductive pattern 320 and the third conductive pattern 349 may each include a same material and/or different materials. The peripheral first conductive pattern 310 and the first conductive pattern 320 may be partially and/or completely formed simultaneously during a same process. The third conductive pattern 349 may also be simultaneously formed with the peripheral first conductive pattern 310 and the first conductive pattern 320.

After forming the peripheral first conductive patterns 310, the first conductive pattern 320 and the third conductive pattern 349, a peripheral capping pattern 312, the second capping pattern 322 and a third capping pattern 353 may be formed on the semiconductor substrate 200. More particularly, the second capping pattern 322, a peripheral capping pattern 312 and the third capping pattern 353 may be formed on the first conductive pattern 320, the peripheral first conductive pattern 310 and the third conductive pattern 349, respectively. The second capping pattern 322 and the peripheral capping pattern 312 may be partially and/or completely formed simultaneously during a same process. The third capping pattern 353 may also be simultaneously formed with the second capping pattern 322 and peripheral capping pattern 312.

Figure 20:
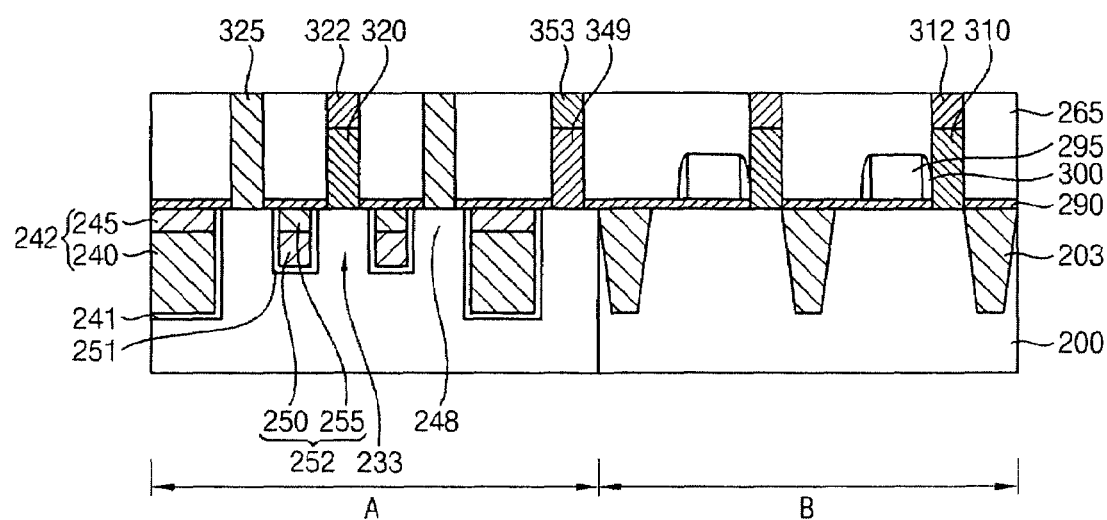

Referring to FIG. 20, the first insulating film 265 and the gate insulating layer 290 may then be further patterned to expose other respective portions of the semiconductor substrate 200. Conductive material for forming the second conductive patterns 325 may then be deposited and subjected to an etchback to form the second conductive patterns 325 on the semiconductor substrate 200. The second conductive patterns 325 may be formed to be electrically connected to a respective one of the impurity regions 248 in the cell region (region A). More particularly, e.g., the second conductive patterns 325 may be formed on respective ones of impurity regions 248. The conductive material for forming the second conductive patterns 325 may include, e.g., poly-silicon.

More particularly, in embodiments, e.g., a respective one of the second conductive patterns 325 may be formed on and/or electrically connected to one of the impurity regions 248 associated with a respective one of the buried gates 252 and a respective one of the first conductive patterns 320 may be formed on and/or electrically connected to another of the impurity regions 248 associated with the respective buried gate 252.

Figure 21:
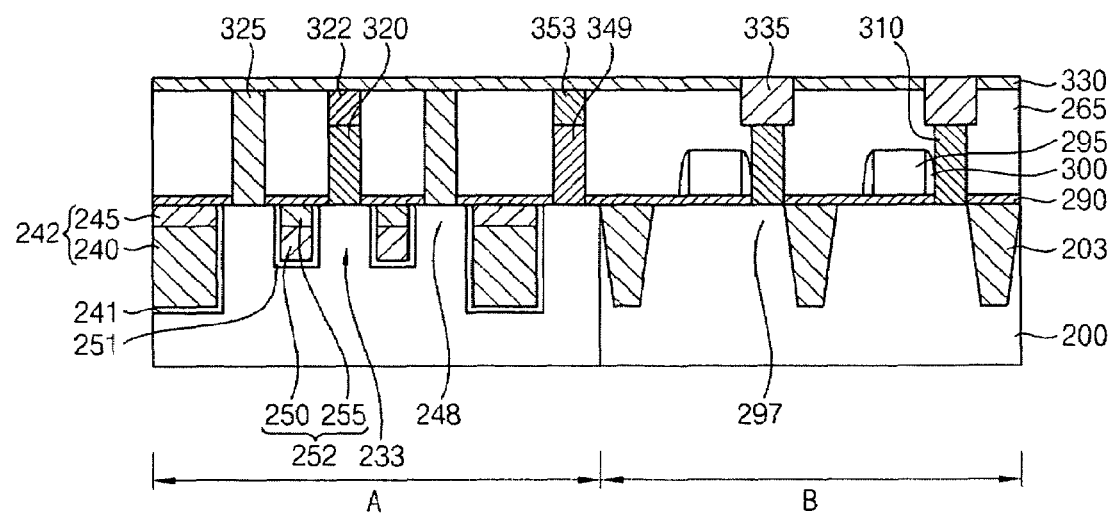

Referring to FIG. 21, the etch stop layer 330 may be formed on the semiconductor substrate 200. More particularly, the etch stop layer 330 may be formed on, e.g., the first insulating layer 265, the peripheral capping pattern 312, the second capping pattern 322 and the third capping pattern 353. The etch stop layer 330 may include, e.g., nitride.

A photoresist layer (not shown) may then be formed and patterned on the semiconductor substrate 200. More particularly, e.g., the patterned photoresist layer may be formed on the etch stop layer 330. The patterned photoresist layer may be employed to selectively remove, e.g., etch, respective portions of the etch stop layer 330, the peripheral capping pattern 312 and/or at least a portion of the first insulating layer 265 above the peripheral first conductive pattern 310. The peripheral second conductive pattern 335 may then be formed on the semiconductor substrate 200. For example, the peripheral conductive pattern 335 may be formed in an opening defined by the etch stop layer 330. More particularly, e.g., the peripheral second conductive pattern 335 may include, e.g., copper, and may be formed using a damascene process.

Figure 22:
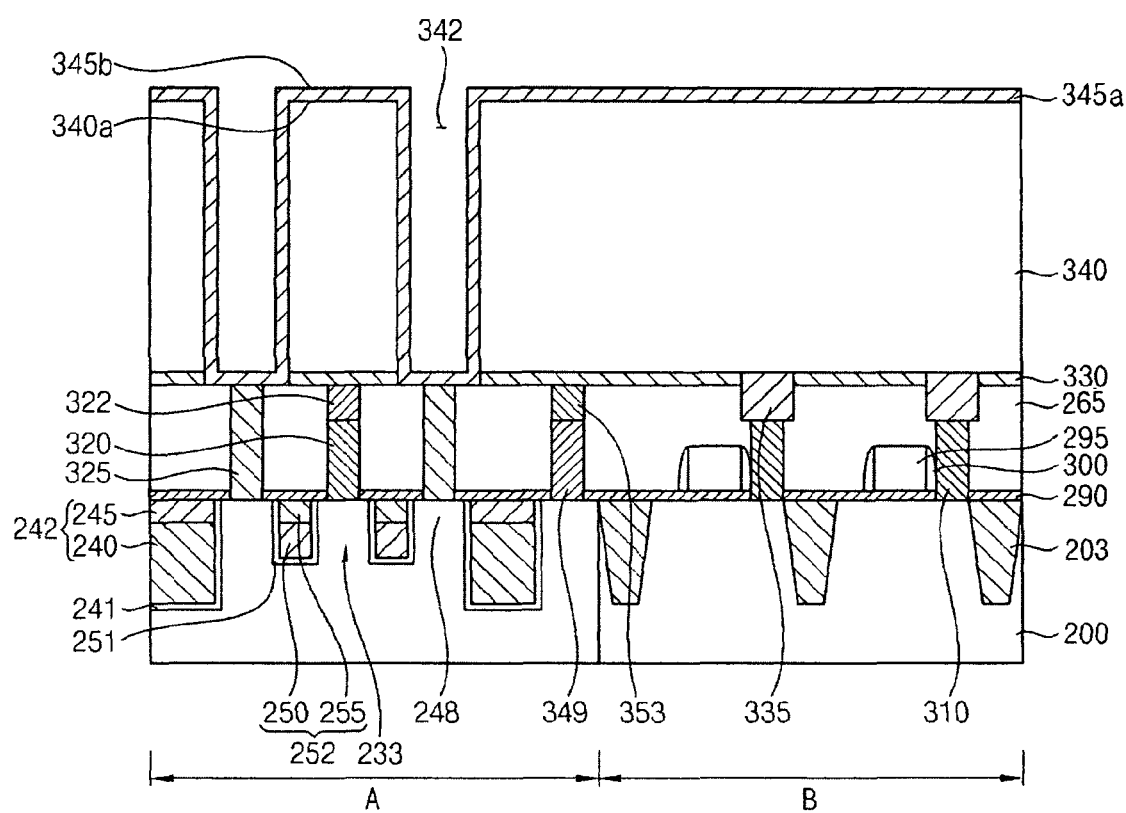

Referring to FIGS. 9 and 22, the charge storage element 360 may be formed on the semiconductor substrate 200 using, e.g., a conventional process. More particularly, e.g., respective portions of the etch stop layer 330 above the second conductive patterns may be removed, e.g., etched, to expose upper surfaces of the second conductive patterns 325. A fifth patterning layer 340 may be formed on the etch stop layer 330. The fifth patterning layer 340 may then be deposited and patterned, e.g., selectively etched, to remove portions of the fifth patterning layer 340 above the second conductive patterns 325. The lower electrode layer 345a may then be formed on the semiconductor substrate 200, and more particularly, on the fifth patterning layer 340 and the exposed portions of the second conductive patterns 325 and/or the first insulating layer 265. The lower electrode layer 345a may define trenches 342 between respective portions thereof.

Figure 23:
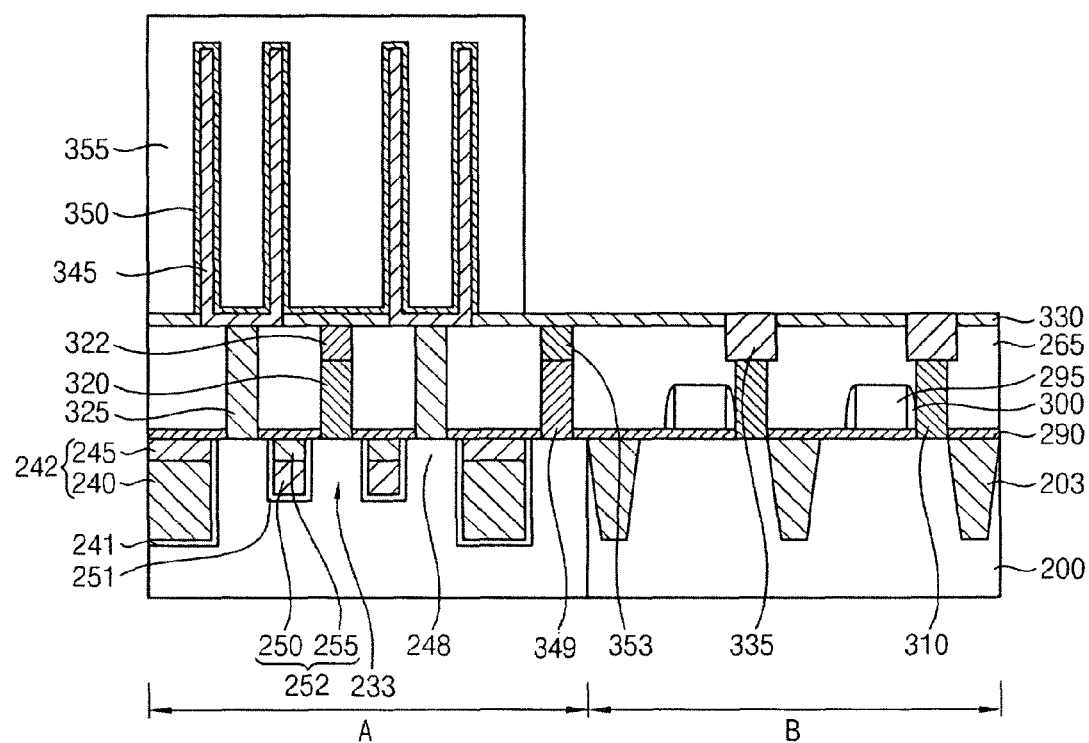

Referring to FIG. 23, upper surfaces 345b of the lower electrode layer 345a may be removed using, e.g., CMP, so as to expose, e.g., completely, an upper surface 340a of the fifth patterning layer 340. Remaining portions of the fifth patterning layer 340 may then be removed, e.g., etched. The resulting lower electrodes 345 may have a U-like pattern, with a base of the U-like pattern electrically contacting the respective second conductive pattern 325. The insulating film 350 may then be formed on the semiconductor substrate 200. More particularly, the insulating film 350 may be formed on exposed portions of the lower electrodes 345 and respective portions of the etch stop layer 330. The upper electrode 355 may be formed on the insulating film 350.

Referring to FIGS. 9, 22 and 23, in the peripheral region (region B), the fifth patterning layer 340 may be removed, e.g., etched, to expose respective portions of the etch stop layer 330 and the peripheral second conductive patterns 335. The second insulation layer 365 may be deposited and patterned to form openings exposing the third conductive pattern 349 and/or the peripheral second conductive pattern 335. Conductive material, e.g., metal, may be deposited in the openings to form the metal patterns 370 and/or the second metal patterns 375. The peripheral second conductive pattern 335 may be wider along the first direction, e.g., x-direction relative to the metal patterns 370 and the second metal patterns 375.

Figure 24:
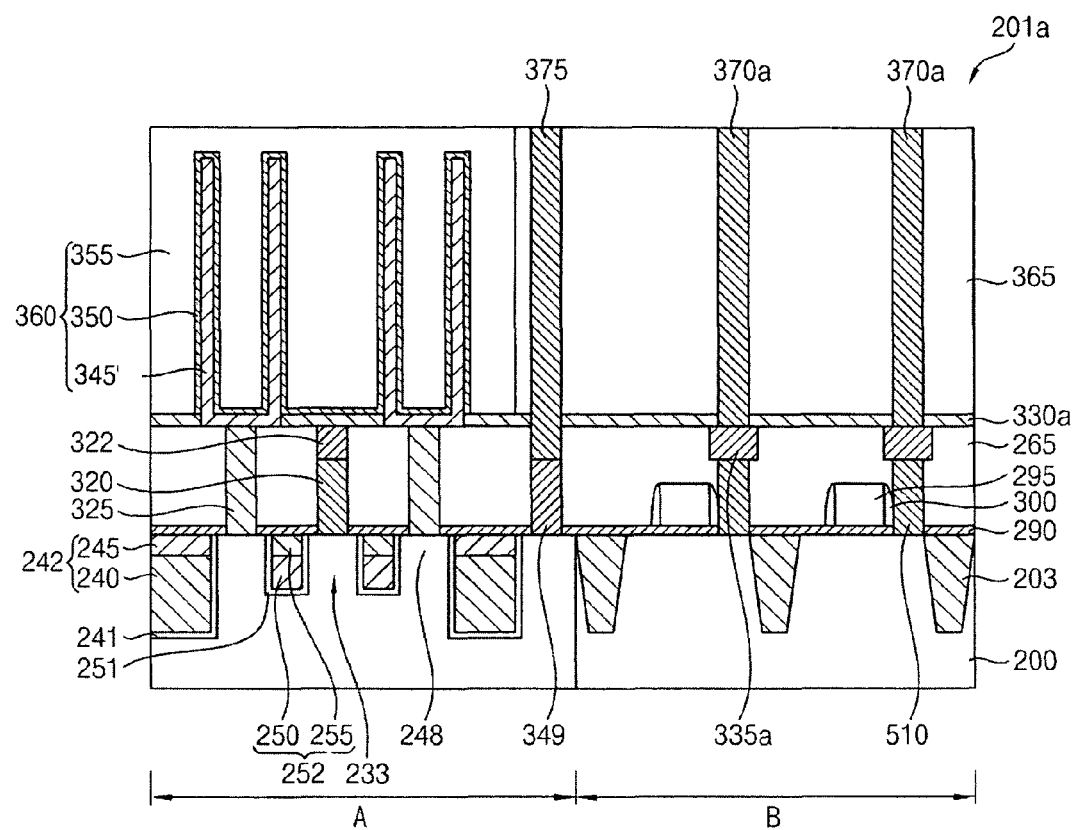
FIG. 24 illustrates a cross-sectional view of an exemplary memory device according to another exemplary embodiment.
Figure 25:
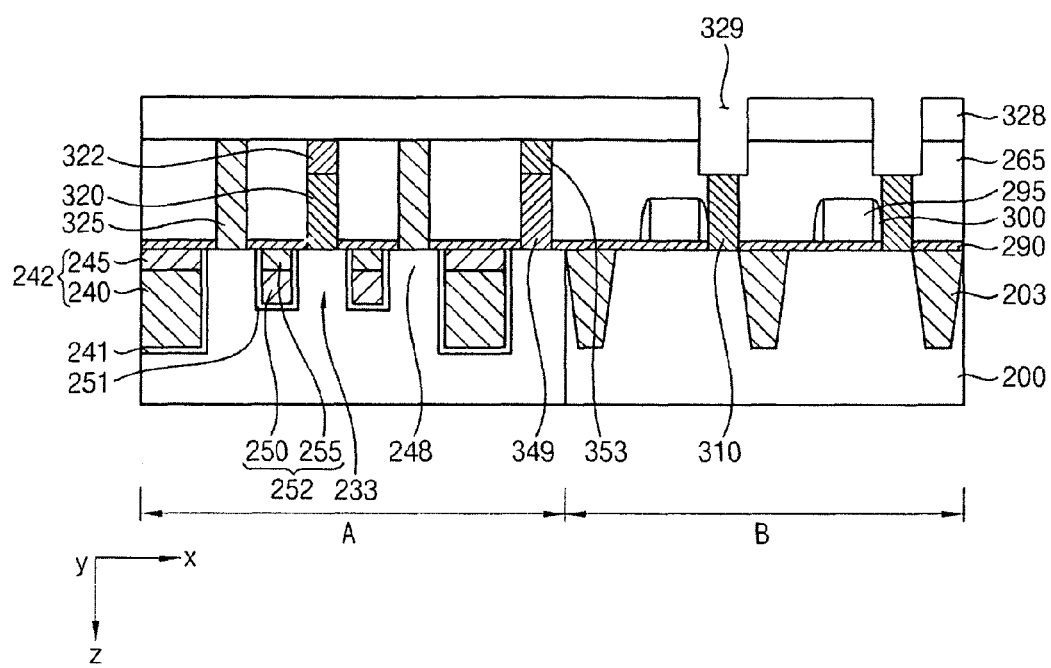
FIGS. 25, 26, 27 and 28 illustrate cross-sectional views of intermediate structures of stages employable in an exemplary method of forming the exemplary memory device of FIG. 24.

It should be understood that the scope of the invention is not limited to the exemplary embodiments described above and illustrated in the accompanying figures. For example, FIG. 24 illustrates a cross-sectional view of an exemplary memory device 201a according to another exemplary embodiment. FIGS. 25, 26, 27 and 28 illustrate cross-sectional views of intermediate structures of stages employable in an exemplary method of forming the exemplary memory device 201a of FIG. 24. In general, only differences between the exemplary device 201a of FIG. 24 and the exemplary device 201 of FIG. 9 will be described below. More particularly, e.g., alternative features described below in connection to FIGS. 26, 27 and 28 may be employed as an alternative to corresponding features described above in connection with FIGS. 21, 22 and 23. That is, features described in connection with FIGS. 24, 25, 26, 27 and 28 may be applied to the exemplary intermediate structure of FIG. 20. In general, only differences between the exemplary method of FIGS. 24-28 and the exemplary method of FIGS. 9-23 will be described below.

Referring to FIG. 24, the exemplary device 201a may include an etch stop layer 330a and a peripheral second conductive pattern 335a. In contrast to the exemplary method described in connection with FIGS. 21, 22 and 23, in the exemplary method of FIGS. 24-28, the peripheral second conductive patterns 335a may be formed before the etch stop layer 330a is formed. That is, e.g., referring to FIGS. 24 and 25, a photoresist layer 328 may be formed and patterned on semiconductor substrate 200. More particularly, the photoresist layer 328 may be patterned so as to expose the peripheral capping pattern 312. Using the patterned photoresist layer 328, the peripheral capping pattern 312 and/or a portion of the first insulating layer 265 may be removed so as to expose the peripheral first conductive pattern 310. More particularly, referring to FIG. 25, the photoresist layer 328 may be formed on the intermediate structure of FIG. 20.

Figure 26:
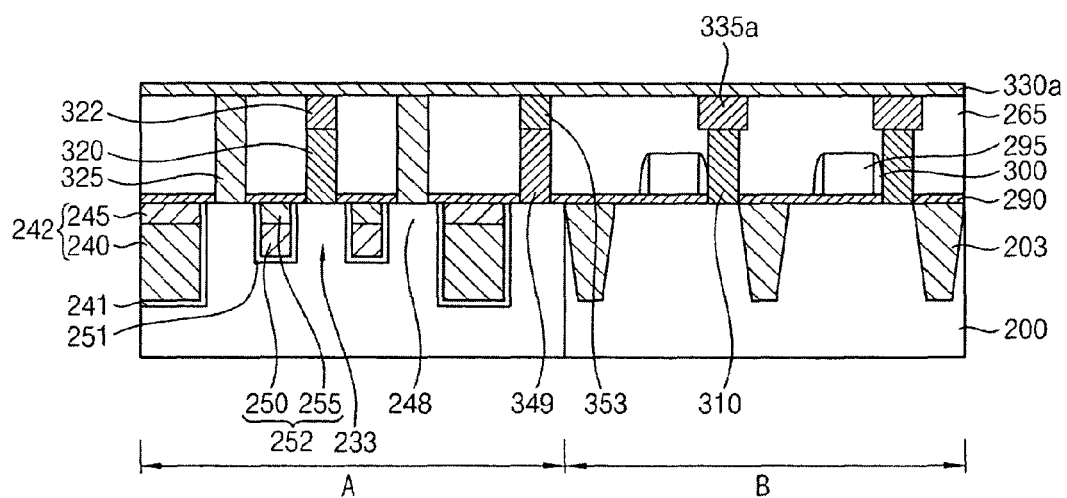

Referring to FIG. 26, after exposing the peripheral first conductive pattern 310, the peripheral second conductive pattern 335a and the second etch stop layer 330a may be formed on the semiconductor substrate 200. The peripheral second conductive pattern 335a may be formed to be in electrical contact with the first conductive pattern 310. That is, e.g., the peripheral second conductive pattern 335a may be formed on the exposed portion of the first conductive pattern 310 and/or on a respective portion of the first insulating layer 265. As shown in FIG. 26, the photoresist layer 328 may be removed prior to forming the second etch stop layer 330a.

Figure 27:
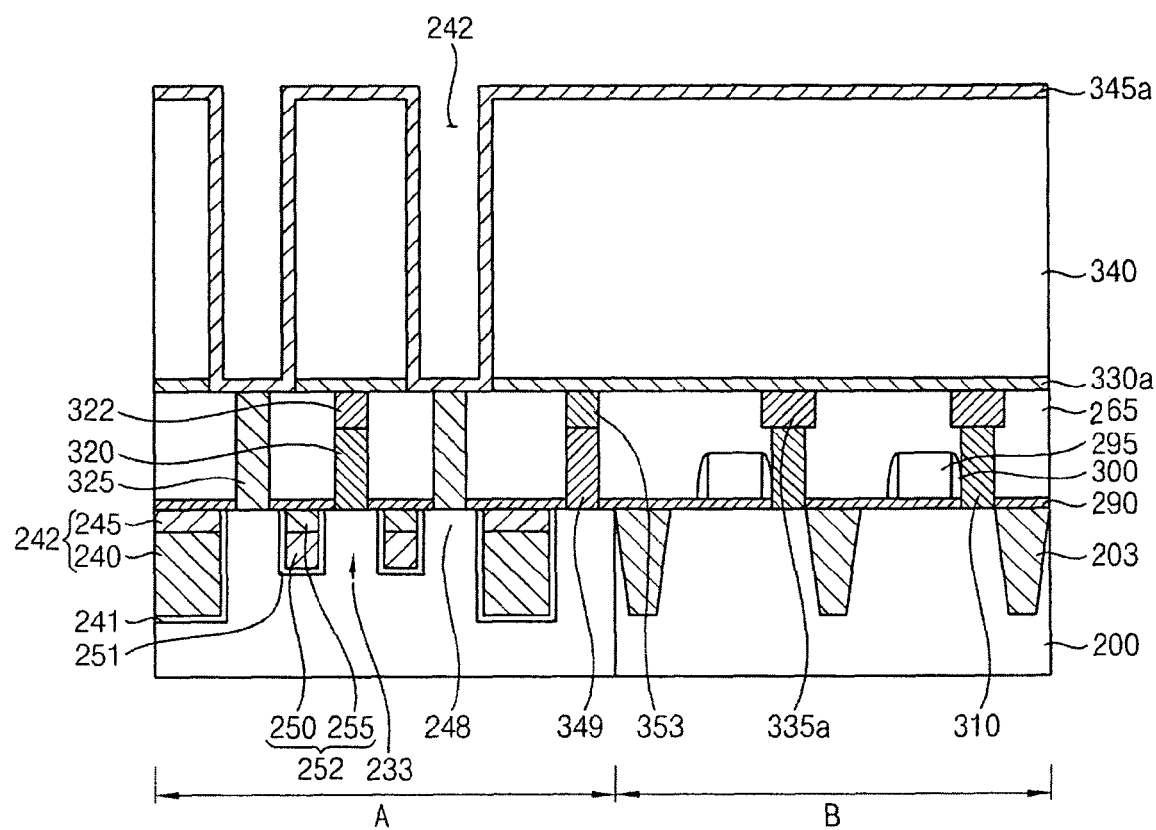

Referring to FIG. 27, after forming the second etch stop layer 330a, the fifth patterning layer 340 may be deposited and patterned, as described in connection with FIG. 22. Further, as described with FIG. 22, respective portions of the second etch stop layer 330a may be removed to expose respective portions of the second conductive pattern 325. The lower electrode layer 345a may be formed on the fifth patterning layer 340, the second conductive patterns 325 and/or the first insulating layer 265. Portions of the lower electrode layer 345a may be selectively removed to define the lower electrodes 345 and to expose portions of the fifth patterning layer 340.

Figure 28:
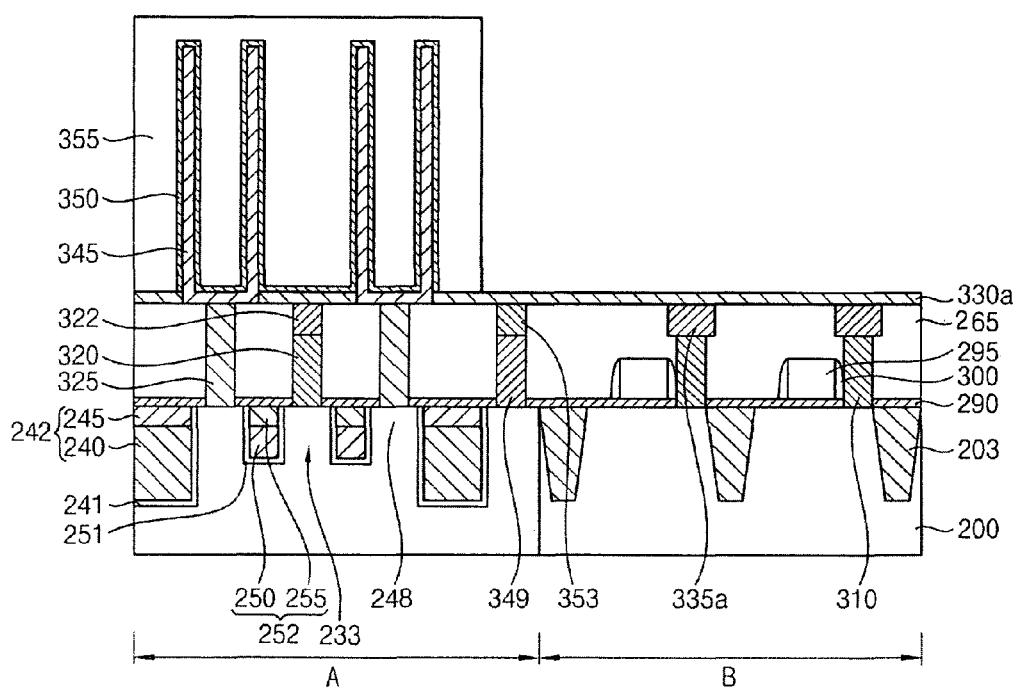

Referring to FIG. 28, the fifth patterning layer 340 may be removed, and the insulating film 350 and the upper electrode 355 may be formed, e.g., in the cell region (region A). In the peripheral region (region B), in contrast to the etch stop layer 330 of the exemplary embodiment of FIGS. 21-23 that was etched prior to formation of the peripheral second conductive pattern 335, in the exemplary embodiment of FIGS. 24-28, the etch stop layer 330a formed after formation of the second conductive pattern 335a still completely covers the peripheral second conductive pattern 335a. Accordingly, portions of the etch stop layer 330a may be selectively removed, e.g., etched, to expose the peripheral second conductive patterns 335a.

Referring back to FIG. 24, the second insulating layer 265 may be formed and patterned. The metal pattern 370a and/or the second metal pattern 375 may be formed so as to be electrically connected to the peripheral second conductive pattern 335 and/or the third conductive pattern 349, respectively.

Figure 29:
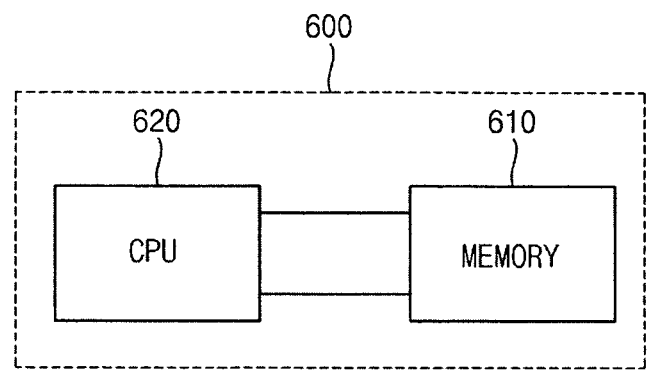
FIG. 29 illustrates a block diagram of an exemplary embodiment of a system employing the semiconductor device of FIGS. 1 and/or 24.

FIG. 29 illustrates a block diagram of an exemplary embodiment of a system 600 employing, e.g., the semiconductor device 101, 201, 201a of FIGS. 1, 9 and/or 24. The system 600 may include a central processing unit (CPU) 620 and a memory 610. The memory 610 may include a plurality of semiconductor devices including one or more of the features described above with regard to the semiconductor devices 101, 201, 201a of FIGS. 1, 9 and/or 24. The system 600 may be, e.g., a flash memory system. More particularly, the system 600 may be, e.g., a DRAM-flash memory system.

Figure 30:
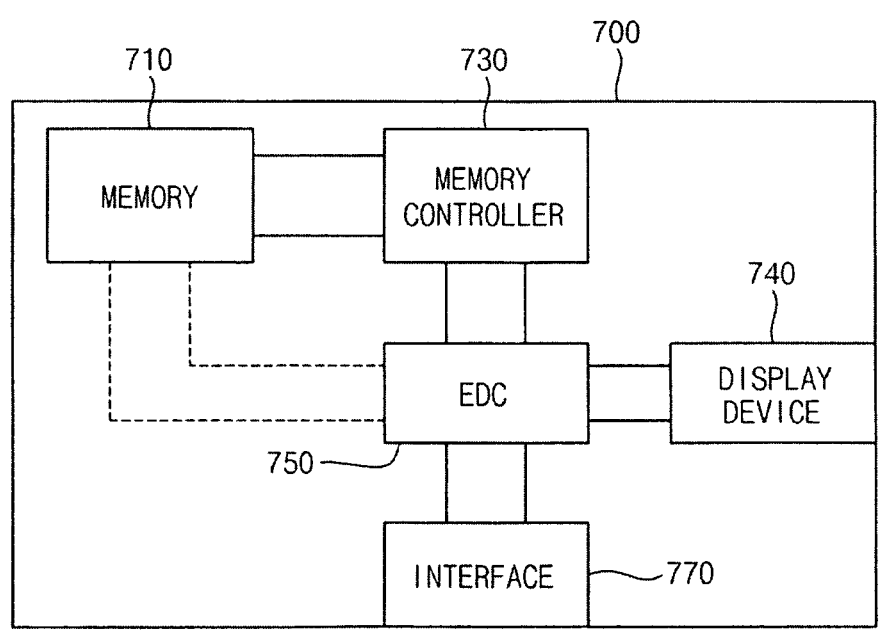
FIG. 30 illustrates a block diagram of another exemplary embodiment of a system employing the semiconductor device of FIGS. 1 and/or 24.

FIG. 30 illustrates a block diagram of another exemplary embodiment of a system 700 employing, e.g., the semiconductor device 101, 201, 201a of FIGS. 1, 9 and/or 24. The system 700 may include a memory 710, a memory controller 730, a display/presentation device 740, an encoder and decoder (EDC) 750, and an interface 770. The memory 710 may include a plurality of semiconductor devices including one or more of the features described above with regard to the semiconductor devices 101, 201, 201a of FIGS. 1, 9 and/or 24.

Data may be input/output to/from the memory 720 via the memory controller 730. The EDC 750 may receive control signals, which may be input/output via the interface 770. The interface 770 may conform to a known standard, e.g., USB, firewire, etc. The interface 770 may include more than one interface, e.g., firewire interface, and/or USB interface, etc. The EDC 750 may encode data for storage in the memory 720. The EDC 750 may decode output from the memory 720. The EDC 750 may include multiple decoders for different data types based on different data formats. For example, the EDC 750 may include an MPED encoder for video data and an MP3 encoder for audio data. The system 700 may be, e.g., a display system.

In the figures, the dimensions of layers and regions may be exaggerated for clarity of illustration. It will also be understood that when an element is referred to as being "on" another element, it can be directly on the other element, or intervening elements may also be present. In addition, it will also be understood that when an element is referred to as being "between" two elements, it may be the only element between the two elements, or one or more intervening elements may also be present. Additionally, it will be understood that when an element is referred to as being "between" two elements, it may be physically arranged between facing/overlapping portions of the two elements, it may be physically arranged such that one of the elements is below it and the other element is above it, or it may be such that it is along a path connecting the two elements. Like reference numerals refer to like elements throughout the specification.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the terms "a" and "an" are open terms that may be used in conjunction with singular items or with plural items.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a semiconductor device, comprising:
    forming and patterning a plurality of layers on a semiconductor substrate to form a patterned structure;
    simultaneously forming isolation trenches and buried gate trenches in the semiconductor substrate by selectively removing portions of the patterned structure, the isolation trenches defining active regions of the semiconductor substrate;
    forming a conductive pattern in the isolation trenches and the buried gate trenches; and
    forming a capping layer on the conductive patterns in the isolation trenches and the buried gate trenches,
    wherein forming and patterning the plurality of layers to form the patterned structure includes:
        forming a first insulation layer on the semiconductor substrate;
        forming a patterning layer on the first insulation layer;
        forming a pattern by patterning the patterning layer to expose portions of the first insulation layer and define trenches in the pattern;
        forming a first layer on the portions of the first insulation layer exposed by the pattern to partially fill the trenches defined by the pattern;
        forming a second layer on the first insulation layer, the second layer filling the partially filled trenches defined by the pattern;
        performing a planarization process to expose upper surfaces of the pattern, the first layer, and the second layer;
        removing the pattern to expose sidewalls of the first layer;
        forming spacers on the sidewalls of the first layer; and
        removing a portion of the first insulation layer to expose portions of the semiconductor substrate.

2. A method of forming a semiconductor device, comprising:
    forming and patterning a plurality of layers on a semiconductor substrate to form a patterned structure that includes a first layer having a different etch rate from a second layer;
    simultaneously forming isolation trenches and buried gate trenches in the semiconductor substrate, the isolation trenches defining active regions of the semiconductor substrate, the isolation trenches being formed by selectively removing portions of the semiconductor substrate, and the buried gate trenches being formed by selectively removing portions of the patterned structure to remove a part of the first layer covering lateral sides of the second layer such that another part of the first layer under a lower side of the second layer remains;
    forming a conductive pattern in the isolation trenches and the buried gate trenches; and
    forming a capping layer on the conductive patterns in the isolation trenches and the buried gate trenches, wherein forming and patterning the plurality of layers to form the patterned structure includes:
        forming a first insulation layer on the semiconductor substrate;
        forming a patterning layer on the first insulation layer;
        forming a pattern by patterning the patterning layer to expose portions of the first insulation layer and define trenches in the pattern;
        forming the first layer on the portions of the first insulation layer exposed by the pattern to partially fill the trenches defined by the pattern;
        forming the second layer on the first insulation layer, the second layer filling the partially filled trenches defined by the pattern;

performing a planarization process to expose upper surfaces of the pattern, the first layer and the second layer;

removing the pattern to expose sidewalls of the first layer;

forming spacers on the sidewalls of the first layer; and removing a portion of the first insulation layer to expose portions of the semiconductor substrate.

3. The method as claimed in claim 2, further comprising:

forming a gate insulating layer in the isolation trenches and the buried gate trenches.

4. The method of forming a semiconductor device as claimed in claim 2, wherein:

forming the conductive patterns includes forming the conductive patterns such that an upper surface of the conductive pattern is below an upper surface of the semiconductor substrate, forming the capping layers includes covering exposed surfaces of the conductive patterns, and an upper surface of the capping layer is substantially and/or completely aligned with the upper surface of the semiconductor substrate.

5. The method of forming a semiconductor device as claimed in claim 2, wherein simultaneously forming isolation trenches and buried gate trenches in the semiconductor substrate includes etching portions of the semiconductor substrate exposed by the first insulation layer and portions of the semiconductor substrate below exposed portions of the first layer.

6. The method of forming a semiconductor device as claimed in claim 2, wherein a material of the spacers and a material of the second layer are same.

7. The method of forming a semiconductor device as claimed in claim 2, wherein a distance between adjacent ones of the spacers is greater than a distance between facing wall portions of a respective one of the spacers and the second layer.

8. The method of forming a semiconductor device as claimed in claim 2, wherein forming the conductive pattern includes depositing a same conductive material in the isolation trenches and the buried gate trenches.

9. The method of forming a semiconductor device as claimed in claim 2, wherein forming the capping layer includes depositing a same capping material on the conductive patterns in the isolation trenches and the buried gate trenches.

10. The method of forming a semiconductor device as claimed in claim 2, wherein:

the semiconductor substrate includes a cell region and a peripheral region, simultaneously forming isolation trenches and buried gate trenches in the semiconductor substrate includes simultaneously forming the isolation trenches and the gate trenches on the cell region of the semiconductor substrate, and the method further includes forming peripheral isolations in the peripheral region independently of forming the isolation trenches and the buried gate trenches in the cell region.

11. The method of forming a semiconductor device as claimed in claim 2, further comprising forming a conductive line that electrically connects the conductive patterns of the isolations trenches together.

12. The method of forming a semiconductor device as claimed in claim 2, wherein the patterned structure is formed such that an upper side of the second layer and an upper side of the first layer are exposed, and the first layer covers the lateral sides and the lower side of the second layer.

* * * * *